United States Patent
Tanaka et al.

(10) Patent No.: US 11,112,321 B2
(45) Date of Patent: Sep. 7, 2021

(54) TORQUE DETECTION DEVICE AND SENSOR MODULE

(71) Applicants: DENSO CORPORATION, Kariya (JP); SOKEN, INC., Nisshin (JP)

(72) Inventors: Ken Tanaka, Nisshin (JP); Shigetoshi Fukaya, Kariya (JP); Toshiro Suzuki, Kariya (JP); Satoru Jinno, Kariya (JP)

(73) Assignees: DENSO CORPORATION, Kariya (JP); SOKEN, INC., Nisshin (JP)

( * ) Notice: Subject to any disclaimer, the term of this patent is extended or adjusted under 35 U.S.C. 154(b) by 92 days.

(21) Appl. No.: 16/590,717

(22) Filed: Oct. 2, 2019

(65) Prior Publication Data

US 2020/0041366 A1    Feb. 6, 2020

Related U.S. Application Data

(63) Continuation of application No. PCT/JP2018/010275, filed on Mar. 15, 2018.

(30) Foreign Application Priority Data

Apr. 28, 2017 (JP) .............................. JP2017-089964
Aug. 24, 2017 (JP) .............................. JP2017-161259

(51) Int. Cl.
*G01L 3/10* (2006.01)
*G01R 33/00* (2006.01)
*B62D 6/10* (2006.01)

(52) U.S. Cl.
CPC ................ *G01L 3/104* (2013.01); *B62D 6/10* (2013.01); *G01R 33/0047* (2013.01)

(58) Field of Classification Search
CPC ........ G01L 3/104; B62D 6/10; G01R 33/0047
USPC ........................ 73/862.352, 862.331–862.338
See application file for complete search history.

(56) References Cited

U.S. PATENT DOCUMENTS

| 8,957,678 B2* | 2/2015 | Oota ........................ G01L 3/104 324/251 |
| 9,097,559 B2* | 8/2015 | Ronnat ................ G01D 5/2458 |
| 9,255,857 B2* | 2/2016 | Hotta .................... B62D 5/0481 |
| 2002/0189371 A1* | 12/2002 | Nakane .................. G01L 5/221 73/862.333 |

(Continued)

FOREIGN PATENT DOCUMENTS

| JP | 2006-071326 A | 3/2006 |
| JP | 5153490 B2 | 3/2013 |

(Continued)

*Primary Examiner* — Octavia Hollington
(74) *Attorney, Agent, or Firm* — Posz Law Group, PLC

(57) ABSTRACT

A torque detection device includes a first magnetic circuit part, a second magnetic circuit part, a circuit board module, and a sensor housing. The first magnetic circuit part is disposed on one side of a multipolar magnet in an axial direction. The second magnetic circuit part is disposed on the other side of the multipolar magnet in the axial direction. The circuit board module includes plural magnetic sensors mounted thereon and facing the magnetic circuit on one end side in a width direction being included in the plane and intersecting the arrangement direction. The sensor housing is coupled to one end side in the arrangement direction of the circuit board module so as to support the circuit board module on the one end side in the arrangement direction of the circuit board module.

15 Claims, 25 Drawing Sheets

(56) References Cited

U.S. PATENT DOCUMENTS

| | | | |
|---|---|---|---|
| 2010/0071481 A1* | 3/2010 | Arita | B62D 6/10 |
| | | | 73/862.333 |
| 2013/0152702 A1 | 6/2013 | Takahashi et al. | |
| 2015/0033877 A1 | 2/2015 | Hotta et al. | |
| 2015/0040686 A1* | 2/2015 | Maehara | G01L 3/101 |
| | | | 73/862.325 |
| 2015/0369679 A1* | 12/2015 | Ishimoto | G01L 3/101 |
| | | | 73/862.331 |
| 2016/0153849 A1 | 6/2016 | Takahashi et al. | |
| 2016/0153850 A1 | 6/2016 | Takahashi et al. | |
| 2016/0178709 A1 | 6/2016 | Kozawa et al. | |
| 2016/0273982 A1 | 9/2016 | Matsui et al. | |

FOREIGN PATENT DOCUMENTS

| | | |
|---|---|---|
| JP | 5205891 B2 | 6/2013 |
| JP | 2014-092452 A | 5/2014 |
| JP | 2014149180 * | 8/2014 |

* cited by examiner

TORQUE DETECTION DEVICE AND SENSOR MODULE

CROSS REFERENCE TO RELATED APPLICATION

The present application is a continuation application of International Patent Application No. PCT/JP2018/010275 filed on Mar. 15, 2018, which designated the U.S. and claims the benefit of priority from Japanese Patent Application No. 2017-89964 filed on Apr. 28, 2017 and Japanese Patent Application No. 2017-161259 filed on Aug. 24, 2017. The entire disclosures of all of the above applications are incorporated herein by reference.

TECHNICAL FIELD

The present disclosure relates to a torque detection device and a sensor module.

BACKGROUND ART

A torque detection device is configured to output an electric signal corresponding to a torsional torque generated in a torsion bar, the torsional torque being caused by relative rotation between the first shaft and the second shaft, by detecting a change in a magnetic flux density in a magnetic circuit disposed between the first shaft and the second shaft by using a magnetic sensor.

SUMMARY

According to an aspect of the present disclosure, a torque detection device is configured to output an electric signal corresponding to a torsional torque generated in a torsion bar that coaxially couples a first shaft and a second shaft together on a rotation center axis. The torsional torque is caused by relative rotation between the first shaft and the second shaft about the rotation center axis. The torque detection device includes: a first magnetic circuit part disposed on one side of a multipolar magnet in an axial direction parallel to the rotation center axis, the multipolar magnet being configured in such a manner that magnetic poles are alternately inverted in a circumferential direction surrounding the rotation center axis and being disposed coaxially with the torsion bar so as to rotate about the rotation center axis along with the relative rotation; a second magnetic circuit part disposed on the other side of the multipolar magnet in the axial direction; plural magnetic sensors disposed between the first magnetic circuit part and the second magnetic circuit part so as to output an electric signal corresponding to a magnetic flux density in a magnetic circuit formed by the first magnetic circuit part and the second magnetic circuit part, the magnetic sensors being arranged in an arrangement direction included in a plane intersecting the axial direction; a circuit board module including the magnetic sensors mounted thereon and facing the magnetic circuit on one end side in a width direction, the width direction being included in the plane and intersecting the arrangement direction; and a sensor housing coupled to one end side in the arrangement direction of the circuit board module so as to support the circuit board module on the one end side in the arrangement direction of the circuit board module.

DESCRIPTION OF EMBODIMENTS

To begin with, examples of relevant techniques will be described.

A torque detection device is configured to output an electric signal corresponding to a torsional torque generated in a torsion bar that coaxially couples a first shaft and a second shaft together. Further, the present disclosure relates to a sensor module that is mounted on a wall member constituting a casing in an electric power steering apparatus to constitute a torque detection device together with a multipolar magnet and the like housed inside the wall member.

For example, a torque detection device may be provided with a plurality of magnetic sensors (e.g., two magnetic sensors) for failure determination or ensuring redundancy in a system. A plurality of magnetic sensors are arranged on the tangent of the circumference of a circle centered on a central axis of a torsion bar within a plane perpendicular to the central axis direction of the torsion bar.

A plurality of magnetic sensors may be mounted on a circuit board. In this case, the circuit board extends toward the central axis of the torsion bar. That is, the magnetic sensors are arranged in the width direction of the circuit board on the tip part in the extending direction of the circuit board. Further, a sensor housing including a connector part may be fixed to the base end side in the extending direction of the circuit board. A complex of the circuit board and the sensor housing may be referred to as a sensor module.

When the sensor module is used for the purpose of detecting a steering torque in the electric power steering apparatus, there is a possibility that the sensor module is exposed to water. When the width-direction dimension of the circuit board is increased in order to arrange a plurality of magnetic sensors, a waterproof seal structure in a coupling part between the circuit board and the sensor housing becomes upsized or complicated, and it becomes difficult to ensure an excellent waterproof seal performance in the coupling part.

The present disclosure has been made in view of the above exemplary circumstances.

According to one aspect of the present disclosure, a torque detection device and a sensor module have the following configuration.

Hereinbelow, an embodiment will be described with reference to the drawings. Various changes applicable to the embodiment will be collectively described as modifications after a series of descriptions of the embodiment.

Figure 1:
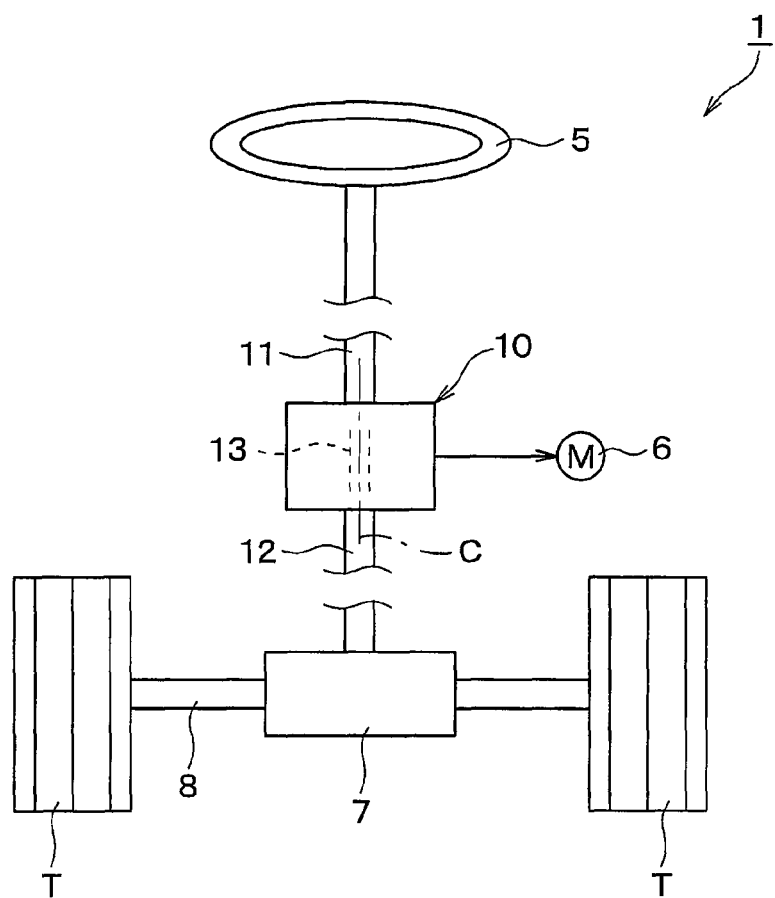
FIG. 1 is a schematic configuration diagram of an electric power steering apparatus equipped with a torque detection device of an embodiment.

Referring to FIG. 1, an electric power steering apparatus 1 includes a steering wheel 5, an electric motor 6, a steering gear mechanism 7, a link mechanism 8, and a torque detection device 10. The electric power steering apparatus 1 is configured to assist a steering force for changing the direction of a wheel T through the link mechanism 8 by driving the electric motor 6 in accordance with an operating state of the steering wheel 5 to transmit a driving force of the electric motor 6 to the steering gear mechanism 7.

The torque detection device 10 is disposed between the steering wheel 5 and the steering gear mechanism 7 so as to output an electric signal (e.g., a voltage) according to the operating state of the steering wheel 5. Specifically, the torque detection device 10 is disposed on a coupling part between a first shaft 11 and a second shaft 12. The first shaft 11 is coupled to the steering wheel 5 through a coupling mechanism (not illustrated) so as to rotate together with the steering wheel 5. The second shaft 12 is coupled to the steering gear mechanism 7 through a coupling mechanism (not illustrated).

The first shaft 11 and the second shaft 12 are coaxially coupled together on a rotation center axis C through a torsion bar 13. The torque detection device 10 is configured to output an electric signal corresponding to a torsional torque generated in the torsion bar 13, the torsional torque being caused by relative rotation between the first shaft 11 and the second shaft 12 about the rotation center axis C.

Hereinbelow, the configuration of the torque detection device 10 will be described with reference to FIGS. 2 to 6. For convenience of description, in each of the drawings, a right-hand XYZ orthogonal coordinate system is set with the Z axis parallel to the rotation center axis C as illustrated. At this time, a direction parallel to the Z axis is referred to as an "axial direction", and any direction within an XY plane is referred to as an "in-plane direction". The in-plane direction is a direction perpendicular to the axial direction. Further, a direction parallel to the X axis is referred to as a "width direction", and a direction parallel to the Y axis is referred to as a "projecting direction". The projecting direction is one direction corresponding to the in-plane direction. The same applies to the width direction. Further, for convenience of description, a Z-axis positive direction side is referred to as an "upper side", and a Z-axis negative direction side is referred to as a "lower side". As described later, the rotation center axis C is not parallel to a vehicle height direction in many cases.

A multipolar magnet 20 is disposed coaxially with the torsion bar 13 so as to rotate about the rotation center axis C along with the relative rotation between the first shaft 11 and the second shaft 12. Specifically, the multipolar magnet 20 is formed in a cylindrical shape and fixed to the lower end of the first shaft 11. As is commonly known, the multipolar magnet 20 is configured in such a manner that magnetic poles are alternately inverted in a circumferential direction surrounding the rotation center axis C. Typically, the "circumferential direction" is a circumferential direction of a circle formed within the XY plane, the circle being centered on an intersection point between the rotation center axis C and the XY plane.

A first magnetic circuit part 21 is disposed on one side in the axial direction (that is, the upper end side) of the multipolar magnet 20. The first magnetic circuit part 21 includes a first yoke member 21a. The first yoke member 21a is a ring-like member formed of a soft magnetic material, and surrounds one end in the axial direction (that is, the upper end) of the multipolar magnet 20.

The first yoke member 21a includes a first ring plate part 21b and a plurality of first tooth parts 21c. The first ring plate part 21b is formed in a flat ring shape, and surrounds the rotation center axis C. That is, a circular opening centered on the rotation center axis C is formed on the first ring plate part 21b. The plurality of the first tooth parts 21c is arranged at regular intervals in the circumferential direction so as to surround the multipolar magnet 20. Each of the plurality of the first tooth parts 21c extends downward from an inner edge of the opening in the first ring plate part 21b along the rotation center axis C.

A second magnetic circuit part 22 is disposed on the other side in the axial direction (that is, the lower end side) of the multipolar magnet 20. The second magnetic circuit part 22 includes a second yoke member 22a. The second yoke member 22a is a ring-like member formed of a soft magnetic material, and surrounds the other end in the axial direction (that is, the lower end) of the multipolar magnet 20.

The second yoke member 22a includes a second ring plate part 22b and a plurality of second tooth parts 22c. The second ring plate part 22b is formed in a flat ring shape, and surrounds the rotation center axis C. That is, a circular opening centered on the rotation center axis C is formed on the second ring plate part 22b. The plurality of the second tooth parts 22c is arranged at regular intervals in the circumferential direction so as to surround the multipolar magnet 20. Each of the plurality of the second tooth parts 22c extends upward from an inner edge of the opening in the second ring plate part 22b along the rotation center axis C.

Figure 3:
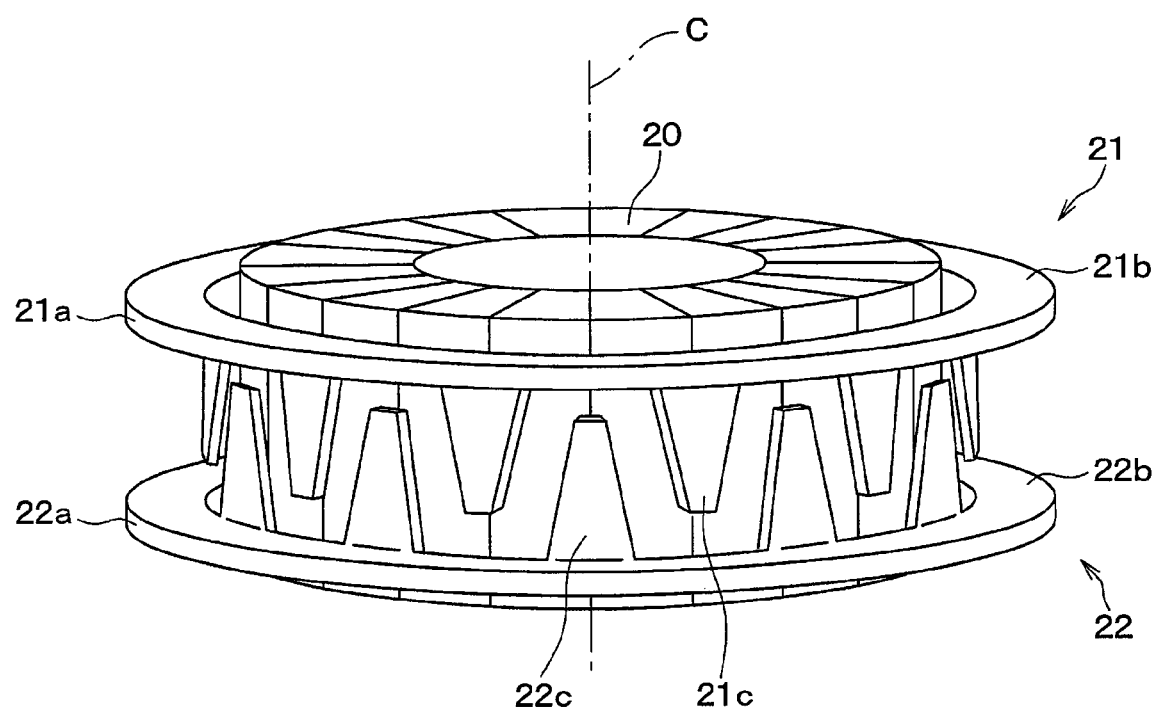
FIG. 3 is an enlarged perspective view of a multipolar magnet, a first magnetic circuit part, and a second magnetic circuit part in an assembled state of the torque detection device illustrated in FIG. 2.

The first magnetic circuit part 21 and the second magnetic circuit part 22 are arranged in the axial direction and opposed to each other with a predetermined gap therebetween. That is, as illustrated in FIG. 3, the second ring plate part 22b is opposed to the first ring plate part 21b in the axial direction. In other words, the first ring plate part 21b and the second ring plate part 22b overlap each other when viewed in the axial direction. Further, the first tooth parts 21c and the second tooth parts 22c are alternately arranged in the circumferential direction. The first magnetic circuit part 21 and the second magnetic circuit part 22 are coupled to the upper end of the second shaft 12, and rotate integrally with the second shaft 12 so as to rotate relative to the multipolar magnet 20.

Figure 4A:
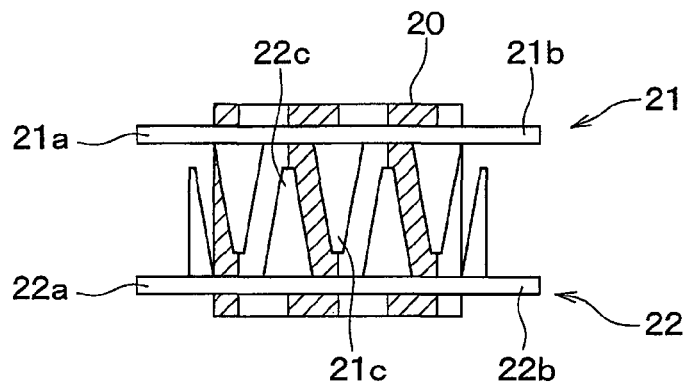
FIG. 4A is a side view illustrating a relative rotation state of the multipolar magnet, the first magnetic circuit part, and the second magnetic circuit part illustrated in FIG. 3.
Figure 4B:
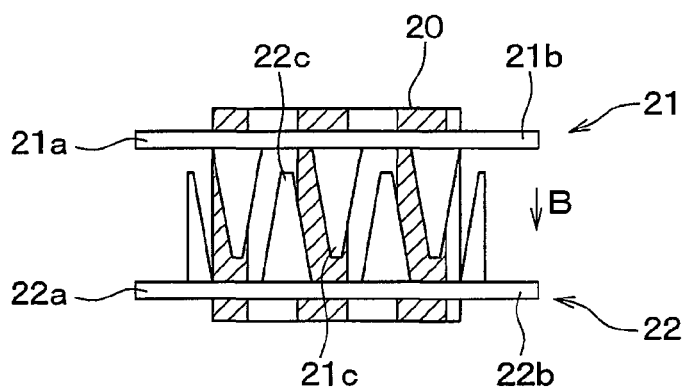
FIG. 4B is a side view illustrating a relative rotation state of the multipolar magnet, the first magnetic circuit part, and the second magnetic circuit part illustrated in FIG. 3.
Figure 4C:
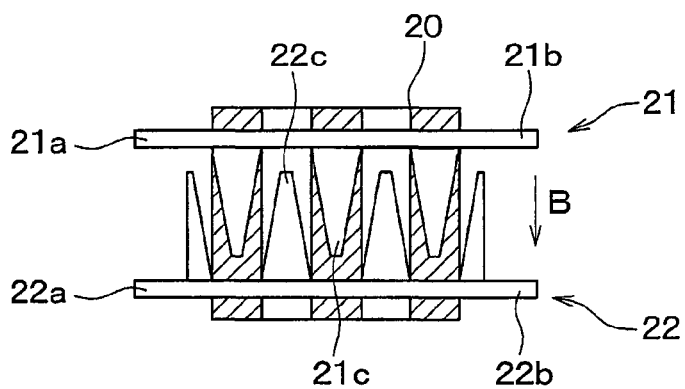
FIG. 4C is a side view illustrating a relative rotation state of the multipolar magnet, the first magnetic circuit part, and the second magnetic circuit part illustrated in FIG. 3.

In an assemble state in which no torsional torque acts on the torsion bar 13, the multipolar magnet 20, the first magnetic circuit part 21, and the second magnetic circuit part 22 are in phase with each other in a neutral state in the circumferential direction as illustrated in FIGS. 3 and 4A. In the neutral state, the central position in the circumferential direction of each of the first tooth parts 21c and the second tooth parts 22c is aligned with the boundary between the N pole and the S pole. Further, the first magnetic circuit part 21 and the second magnetic circuit part 22 are deviated in phase from the neutral state as illustrated in FIG. 4B and FIG. 4C when a torsional torque is generated in the torsion bar 13, the torsional torque being caused by the relative rotation between the first shaft 11 and the second shaft 12 illustrated in FIG. 2, so that a magnetic flux density B corresponding to a phase deviation amount is generated in the gap described above.

Figure 2:
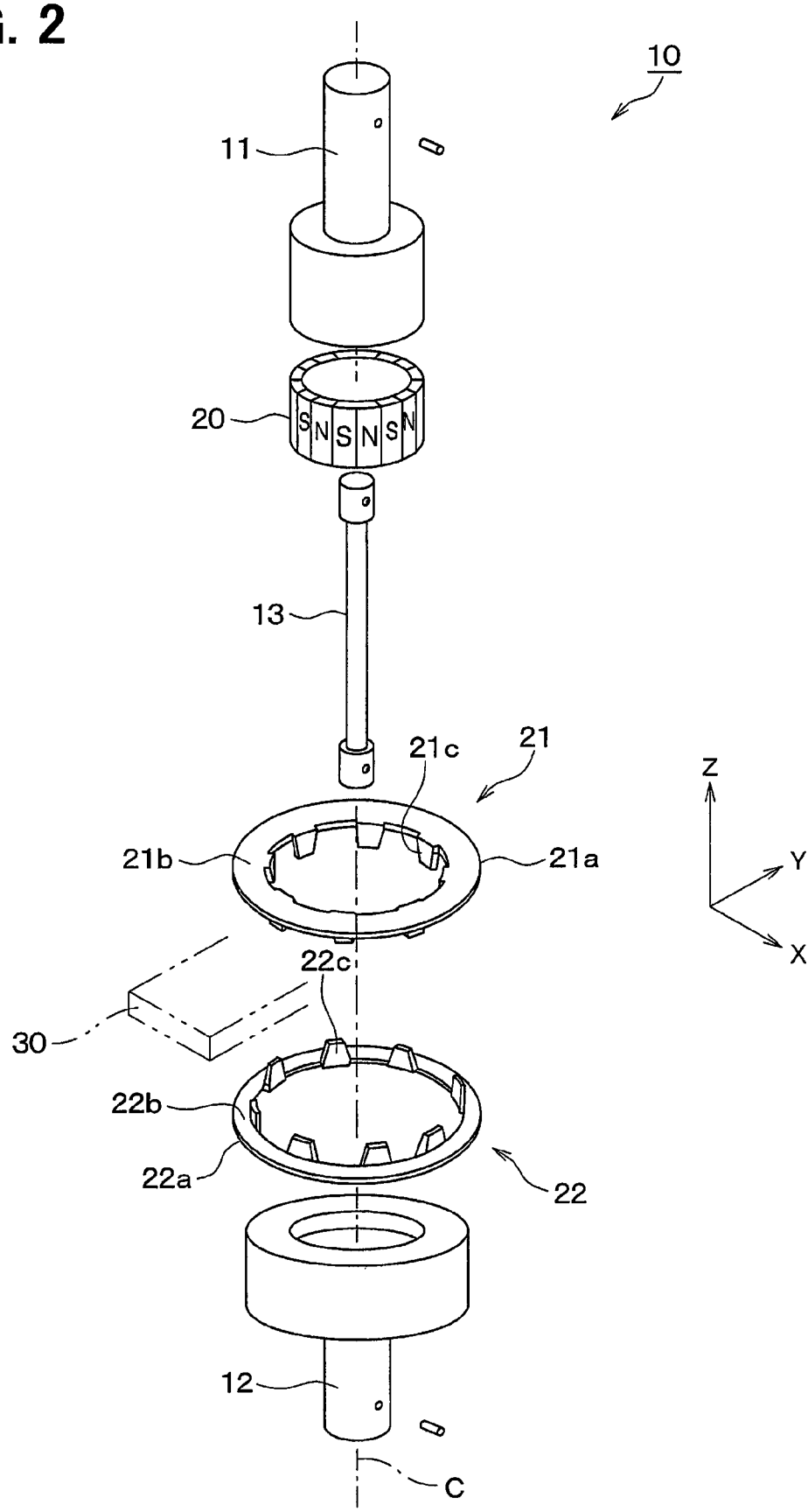
FIG. 2 is an exploded perspective view of the torque detection device illustrated in FIG. 1.

As illustrated in FIG. 2, the sensor module 30 is disposed facing the above gap between the first magnetic circuit part 21 and the second magnetic circuit part 22 in the axial direction. The sensor module 30 is configured to output an electric signal corresponding to the magnetic flux density generated in the gap, that is, an electric signal corresponding to the torsional torque generated in the torsion bar 13. Details of the configuration of the sensor module 30 will be described later.

Figure 5:
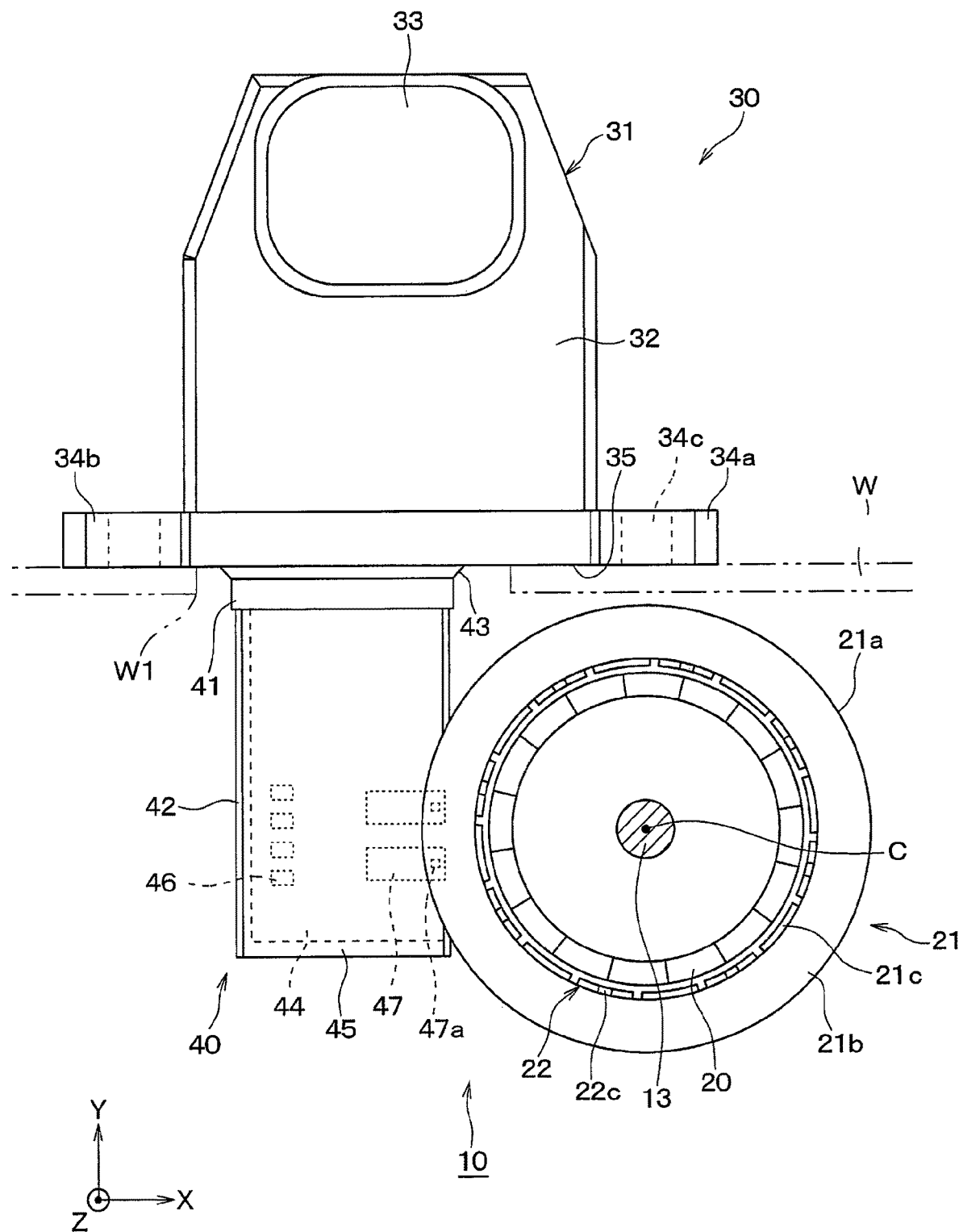
FIG. 5 is a plan view of the torque detection device illustrated in FIG. 1.
Figure 6:
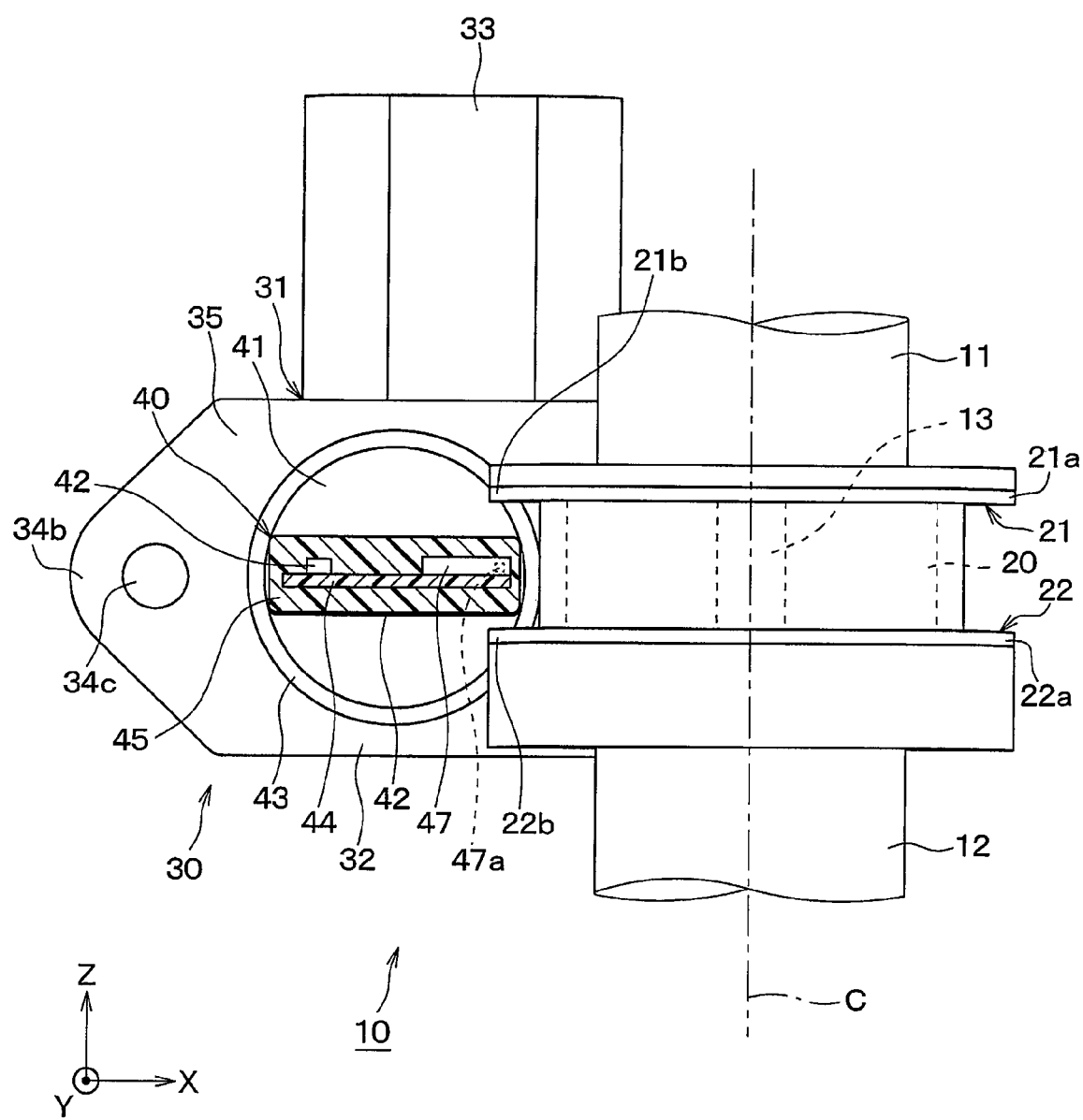
FIG. 6 is a partial sectional view of the torque detection device illustrated in FIG. 2 when viewed in an arrangement direction of magnetic sensors.

Hereinbelow, details of the configuration of the torque detection device 10 according to the present embodiment will be described with reference to FIGS. 5 and 6. In FIG. 6, the first yoke member 21a and the second yoke member 22a are illustrated in a simplified manner to avoid complicated illustration. As illustrated in FIG. 5, the multipolar magnet 20, the first magnetic circuit part 21, and the second magnetic circuit part 22 are housed inside a housing wall W. In the present embodiment, the housing wall W is, for example, a wall member which constitutes a casing in the electric power steering apparatus 1 illustrated in FIG. 1, and rotatably supports and covers the first shaft 11 or the second shaft 12. A mounting hole W1, which is a through hole, is formed on the housing wall W.

The sensor module 30 is fixed to the housing wall W with a part of the sensor module 30 passing through the mounting hole W1. Hereinbelow, the configuration of the sensor module 30 will be described with reference to FIGS. 5 and 6.

A sensor housing 31 which serves as a casing of the sensor module 30 is integrally formed of an insulating synthetic resin. The sensor housing 31 includes a main body part 32, a connector part 33, a first flange part 34a, and a second flange part 34b.

The main body part 32 is formed in a polygonal prism shape (e.g., a quadrangular prism shape) which extends in the projecting direction. The connector part 33 which is used in electrical connection with an external device (e.g., an ECU) extends in the axial direction from the upper end of the main body part 32. ECU stands for an electronic control unit.

The first flange part 34a and the second flange part 34b extend in the width direction from the lower end of the main body part 32. The first flange part 34a and the second flange part 34b are formed in such a manner that lower end faces of the first flange part 34a and the second flange part 34b abut on an outer wall surface (that is, the upper surface in FIG. 5) of the housing wall W around the mounting hole W1 in a state in which the sensor module 30 is fixed to the housing wall W.

The first flange part 34a extends in the X-axis positive direction so as to face the first magnetic circuit part 21 and the second magnetic circuit part 22 with the housing wall W interposed therebetween. That is, when viewed in the projecting direction, the first flange part 34a overlaps the multipolar magnet 20, the first magnetic circuit part 21, and the second magnetic circuit part 22. The second flange part 34b extends in the X-axis negative direction. That is, the second flange part 34b is disposed on the side where the first magnetic circuit part 21 and the second magnetic circuit part 22 are not disposed in the width direction. Hereinbelow, the extending direction of each of the first flange part 34a and the second flange part 34b may be referred to as a "flange extending direction".

The first flange part 34a includes a fixing hole 34c, and the second flange part 34b includes a fixing hole 34c. The fixing holes 34c penetrate the first flange part 34a and the second flange part 34b in a direction perpendicular to the flange extending direction and the axial direction. Each of the fixing holes 34c is formed in such a manner that a bolt or the like (not illustrated) is inserted into the fixing hole 34c when the sensor module 30 is fixed to the housing wall W. In the present embodiment, when viewed in the projecting direction, the fixing hole 34c of the first flange part 34a overlaps the multipolar magnet 20, the first magnetic circuit part 21, and the second magnetic circuit part 22.

An end face 35 of the sensor housing 31 is formed in a substantially flat shape so as to be continuous with the lower end faces of the first flange part 34a and the second flange part 34b. A circuit board module 40 projects in the projecting direction from the end face 35 of the sensor housing 31. That is, the sensor housing 31 is coupled to one end side in the projecting direction (that is, the base end side) of the circuit board module 40 so as to support the circuit board module 40 on the one end side. In other words, the circuit board module 40 extends in a cantilever manner in the Y-axis negative direction from the end face 35 of the sensor housing 31.

In the present embodiment, the projecting direction in which the circuit board module 40 extends from the sensor housing 31 is the in-plane direction which is substantially perpendicular to the axial direction. That is, the projecting direction is a direction intersecting the flange extending direction parallel to the width direction. Specifically, in the present embodiment, the projecting direction is a direction parallel to a normal line of the end face 35. That is, in the present embodiment, the projecting direction is a direction perpendicular to the flange extending direction.

The circuit board module 40 includes a base part 41 and a sensor mounting part 42. The base part 41 is disposed adjacent to the end face 35 of the sensor housing 31. Specifically, the base part 41 is formed in a columnar shape and coupled to the sensor housing 31. The sensor mounting part 42 is formed in a plate-like shape, and projects in the projecting direction from the base part 41. FIG. 6 illustrates a cross section of the sensor mounting part 42 on a plane that is parallel to the XZ plane and passes through the rotation center axis C.

A waterproof seal member 43 having a ring-like shape is disposed on the coupling part between the sensor housing 31 and the circuit board module 40. The waterproof seal member 43 is formed of insulating synthetic rubber or the like. Specifically, in the present embodiment, the waterproof seal member 43 is disposed in a state of a fillet which fills a corner formed by the end face 35 of the sensor housing 31 and the outer peripheral face of the base part 41. The waterproof seal member 43 is formed by applying a synthetic resin caulking agent in liquid or gel form to the corner and curing the caulking agent to liquid-tightly seal the coupling part between the sensor housing 31 and the base part 41. In the present embodiment, the waterproof seal member 43 is formed in a substantially circular shape when viewed in the projecting direction. Further, the outer diameter in the axial direction of the waterproof seal member 43 is smaller than the dimension in the axial direction of the end face 35.

The sensor mounting part 42 includes a circuit board 44 having a thin plate-like shape and a covering member 45 which covers the circuit board 44. The circuit board 44 is disposed in such a manner that the plate thickness direction thereof is parallel to the axial direction. Further, the circuit board 44 is formed in a rectangular shape having long sides parallel to the projecting direction and short sides parallel to the width direction. That is, the width-direction dimension of the circuit board module 40 in the coupling part with the sensor housing 31 is smaller than the projecting dimension from the sensor housing 31.

A plurality of circuit elements including a plurality of capacitors 46 and a plurality of magnetic sensors 47 are mounted on the circuit board 44. The circuit elements are covered with the covering member 45 having waterproofness and disposed on the sensor mounting part 42. That is, the circuit board module 40 has a waterproof structure that covers the circuit elements including the plurality of magnetic sensors 47 and the circuit board 44 on which the circuit elements are mounted with the covering member 45. The covering member 45 is formed of an insulating synthetic resin (e.g., an epoxy resin).

The magnetic sensors 47 are arranged in the projecting direction on one end side in the width direction (that is, the right end side in the drawing) of the circuit board module 40. In the present embodiment, two magnetic sensors 47 are mounted on the circuit board module 40. Hereinbelow, the arrangement direction of the plurality of magnetic sensors 47 may be merely referred to as a "sensor arrangement direction". That is, the sensor arrangement direction is parallel to the projecting direction. On the other hand, the plurality of capacitors 46 is disposed on the other end side in the width direction (that is, the left end side in the drawing) of the circuit board module 40.

Each of the magnetic sensors 47 is disposed between the first magnetic circuit part 21 and the second magnetic circuit part 22 so as to output an electric signal corresponding to a magnetic flux density in a fixed magnetic circuit formed by the first magnetic circuit part 21 and the second magnetic circuit part 22. Specifically, each of the magnetic sensors 47 is a so-called Hall IC, and includes a magnetic induction element 47a, which is a Hall element, inside thereof. The plurality of magnetic sensors 47 is disposed in such a manner that the magnetic induction elements 47a of the respective magnetic sensors 47 are interposed between the first ring plate part 21b and the second ring plate part 22b and arranged in the projecting direction. That is, the circuit board module 40 includes the magnetic sensors 47 mounted thereon and faces the fixed magnetic circuit described above on the one end side in the width direction.

Hereinbelow, effects obtained by the configuration of the present embodiment will be described with reference to each drawing. First, a procedure for mounting the sensor module 30 on the housing wall W in which the multipolar magnet 20, the first magnetic circuit part 21, and the second magnetic circuit part 22 are housed will be described. As described above, the mounting hole W1 which communicates with the outside (that is, the upper side relative to the housing wall W in FIG. 5) is formed on the housing wall W. The sensor module 30 is held in a manner that the other end side in the projecting direction (that is, the tip side) of the circuit board module 40 faces a space inside the housing wall W. Then, the circuit board module 40 is inserted into the mounting hole W1 until the lower end faces of the first flange part 34a and the second flange part 34b come into contact with the outer wall surface of the housing wall W. In this state, the bolts or the like (not illustrated) are inserted into the fixing holes 34c to fix the sensor module 30 to the housing wall W.

In the present embodiment, the sensor module 30 is mounted on the housing wall W in which the multipolar magnet 20, the first magnetic circuit part 21, and the second magnetic circuit part 22 are previously housed to constitute the torque detection device 10. Thus, it is not necessary to release the coupling between the first shaft 11, the second shaft 12, and the torsion bar 13 in mounting and removal of the sensor module 30. Thus, for example, when a failure occurs in the circuit element mounted on the circuit board 44, the failure can be recovered merely by replacing the sensor module 30 without releasing the coupling between the first shaft 11, the second shaft 12, and the torsion bar 13.

In recent years, downsizing of onboard components has been desired in view of vehicle mountability improvement. Also in the torque detection device 10 installed in the electric power steering apparatus 1, downsizing of its body is demanded in order to prevent interference with another onboard component. Specifically, for example, this type of conventional torque detection device is installed around the shaft as described above. Thus, in this type of conventional torque detection device, there is a concern that a product body is upsized in the radial direction. That is, since this type of conventional torque detection device includes a plurality of components stacked in the radial direction, the product body thereof is prone to be upsized in the radial direction. When the product body is upsized in the radial direction, and the radial-direction dimension is increased, there is a concern of interference with onboard peripheral components, which is not preferred for mounting.

For example, in a vehicle having a small engine room dimension, such as a compact car, a mounting space of onboard components is small. Thus, downsizing of onboard components is desired. Also in a large-sized car having a large engine room dimension, downsizing of onboard components is desired in order to improve the flexibility of mounting layout. In particular, in recent years, a mounting space of onboard components has been limited as compared to that in conventional vehicles due to hybrid vehicles, expansion in traveling safety equipment, and the like. Thus, also in the torque detection device 10 installed in the electric power steering apparatus 1, downsizing of the device, in particular, downsizing of the body in the radial direction is demanded in order to prevent interference with another onboard component.

In this point, in the present embodiment, the circuit board module 40 projects in the projecting direction included in the plane intersecting the axial direction. Further, the circuit board module 40 includes the magnetic sensors 47 mounted thereon and faces the fixed magnetic circuit described above on the one end side in the width direction intersecting the projecting direction. Thus, the rotation center axis C is not located ahead in the projecting direction of the circuit board module 40, that is, the circuit board 44. That is, the circuit board module 40 is disposed at a position offset from the multipolar magnet 20, the first magnetic circuit part 21, and the second magnetic circuit part 22 in the width direction which is perpendicular to the axial direction and the projecting direction. Hereinbelow, such a configuration is referred to as an "offset structure".

In the offset structure, the torque detection device 10 does not have a structure in which a plurality of components are stacked in a straight line toward the outer side in the radial direction from the rotation center axis C. That is, the torque detection device 10 does not have a structure in which the sensor housing 31, the circuit board module 40, and the fixed magnetic circuit are stacked in the projecting direction in which the sensor housing 31 and the circuit board module 40 are arranged. Thus, the circuit board module 40 is inserted deep in the internal space of the housing wall W. Thus, the employment of the offset structure makes it possible to reduce the radial-direction dimension of the torque detection device 10 in an onboard state to the extent possible. Accordingly, interference with another onboard component around the torque detection device 10 is satisfactorily prevented. In other words, the configuration of the present embodiment satisfactorily achieves downsizing of the body of the torque detection device 10 and remarkably improves the vehicle mountability of the torque detection device 10. The "radial direction" is a direction radially extending from the rotation center axis C within a plane intersecting the rotation center axis C, specifically, within the XY plane. That is, the radial direction is a radial direction of a circle centered on the rotation center axis C within the plane intersecting the rotation center axis C, specifically, within the XY plane.

In the present embodiment, the sensor arrangement direction in the circuit board module 40 is parallel to the projecting direction which is the extending direction of the circuit board module 40 from the sensor housing 31 and intersects the width direction. Further, the circuit board module 40 is formed in such a manner that the width-direction dimension in the coupling part with the sensor housing 31 is smaller than the projecting dimension from the sensor housing 31. Thus, the present embodiment makes it possible to make the width-direction dimension of the sensor module 30, that is, the circuit board module 40 smaller than that in a conventional configuration (e.g., refer to JP 2016-118488 A) in which a plurality of magnetic sensors 47 are arranged in the width direction.

In a state in which the sensor module 30 is mounted on the housing wall W, an error may develop in the position in the projecting direction of the magnetic induction element 47a. The error is caused by, for example, an error in the fastening force of the bolts described above. However, in the present embodiment, the circuit board module 40 is supported by the sensor housing 31 on the one end side in the projecting direction which constitutes one side in the rectangular shape in plan view. Further, the circuit board module 40 includes the plurality of magnetic sensors 47 mounted thereon and faces the fixed magnetic circuit formed by the first magnetic circuit part 21 and the second magnetic circuit part 22 on the one side (that is, the one end side in the width direction).

In such a configuration, the plurality of magnetic sensors 47 (that is, the magnetic induction elements 47a) is arranged in the mounting/removal direction of the sensor module 30. Thus, the direction in which the position error of the magnetic induction element 47a develops is perpendicular to the radial direction in the fixed magnetic circuit. On the other hand, in the conventional configuration, since the plurality of magnetic sensors 47 (that is, the magnetic induction elements 47a) is perpendicular to the axial direction and the mounting/removal direction of the sensor module 30, a position error of the magnetic induction element 47a develops in the radial direction. Thus, the present embodiment makes it possible to reduce a detection error caused by the position error of the magnetic induction element 47a as compared to the conventional configuration (e.g., refer to JP 2006-71326 A).

Further, in recent years, needs for a configuration that continues an assist operation even when a failure occurs in some components have been growing in the electric power steering apparatus 1.

In this point, it is known that water may enter inside the casing of the electric power steering apparatus 1 due to "boot breakage" which accidentally occurs. When the electric power steering apparatus 1 has a so-called rack type configuration (that is, refer to FIG. 17 described later), water that has entered inside the casing of the electric power steering apparatus 1 may reach the torque detection device 10. If water enters inside the torque detection device 10 and a failure of the circuit board 44 occurs, output of a torque detection signal is stopped due to the failure, which stops the operation of the electric power steering apparatus 1.

In order to make the circuit board 44 waterproof, it is necessary to interrupt a water intrusion path leading to the circuit board 44 by sealing or the like. In this point, a conventional torque detection device typically has a configuration in which a magnetism collecting member made of metal such as permalloy is molded of a synthetic resin. However, in such a configuration, the interface between the magnetism collecting member and the mold resin is not sealed, but exposed. Thus, it is difficult to ensure high waterproofness. Further, in this type of conventional device, for example, an annular magnetism collecting member is disposed with respect to a shaft, and a magnetic circuit structure is thus complicated. Thus, in this type of conventional device, it is extremely difficult to ensure high waterproofness.

On the other hand, in the present embodiment, the circuit board module 40 has the waterproof structure that covers the circuit elements including the plurality of magnetic sensors 47 and the circuit board 44 on which the circuit elements are mounted with the covering member 45 having waterproofness. That is, a joint interface between different types of materials (that is, the joint interface between the metal member and the synthetic resin member) is not exposed on the surface of the covering member 45. Thus, the intrusion of water into the circuit board module 40 can be satisfactorily prevented. Further, the waterproof seal member 43 is disposed on the coupling part between the sensor housing 31 and the circuit board module 40. Thus, the present embodiment makes it possible to achieve an excellent waterproof performance in the sensor module 30 with a simple configuration.

In this point, in the present embodiment, the width-direction dimension of the circuit board module 40 is reduced to reduce the width-direction dimension in the coupling part between the sensor housing 31 and the circuit board module 40 to the extent possible. Further, the waterproof seal member 43 is formed in such a manner that the outer diameter in the axial direction is smaller than the dimension in the axial direction of the end face 35 from which the circuit board module 40 projects in the sensor housing 31. Thus, the present embodiment makes it possible to achieve an excellent waterproof performance by reducing the length dimension of the waterproof seal member 43 within the end face 35 to the extent possible.

In the present embodiment, the circuit board module 40 includes the base part 41 which is formed in a columnar shape and coupled to the sensor housing 31 and the sensor mounting part 42 which is formed in a plate-like shape and projects in the sensor arrangement direction from the base part 41. Further, the waterproof seal member 43 disposed on the coupling part between the base part 41 and the sensor housing 31 is formed in a ring-like shape, that is, a substantially circular shape corresponding to the columnar shape of the base part 41. Thus, the present embodiment makes it possible to achieve an excellent waterproof performance by using the waterproof seal member 43 having a circular ring-like shape.

In the present embodiment, the fixed magnetic circuit including the first magnetic circuit part 21 and the second magnetic circuit part 22 includes the first yoke member 21a as the first magnetic circuit part 21 and the second yoke member 22a as the second magnetic circuit part 22. That is, in the present embodiment, the fixed magnetic circuit is provided with no auxiliary magnetism collecting member in addition to the first yoke member 21a and the second yoke member 22a. Such a configuration makes it possible to simplify the structure of the first magnetic circuit part 21 and the second magnetic circuit part 22 which constitute the fixed magnetic circuit having a magnetic flux density varying by the rotation relative to the multipolar magnet 20.

(Modifications)

The present disclosure is not limited to the above embodiment, and the above embodiment can be appropriately modified. Hereinbelow, representative modifications will be described. In the following description of the modifications, only a part different from the above embodiment will be described. Further, in the above embodiment and the modifications, identical or equivalent elements will be designated by the same reference signs. Thus, the description in the above embodiment can be appropriately incorporated in the following description of the modifications for an element having the same reference sign as the above embodiment unless there is a technical contradiction or specific additional description.

The present disclosure is not limited to the specific device configuration illustrated in the above embodiment and drawings. For example, the concept of the up-down direction is set for convenience of description of the embodiment as described above. Thus, the rotation center axis C is the direction intersecting the vehicle height direction in many cases. Further, the rotation center axis C may intersect the Z axis. That is, when the sensor arrangement direction is parallel to the Y axis and the width direction of the circuit board 44 is parallel to the X axis, the rotation center axis C may be set in such a manner that a predetermined angle $\theta 1$ is formed between the rotation center axis C and the Z axis within the XZ plane. At this time, $\theta 1$ is larger than 0 degree ($\theta 1 > 0$ deg). Alternatively, the sensor arrangement direction may be set in such a manner that a predetermined angle $\theta 2$ is formed between the sensor arrangement direction and the Y axis within the YZ plane. That is, $\theta 2$ may be set to approximately an angle that satisfies $\theta 2 > 0$ deg and at which the magnetic induction element 47a fits inside the gap between the first magnetic circuit part 21 and the second magnetic circuit part 22.

The multipolar magnet 20 may be fixed to the first shaft 11 or may be fixed to one end side in the axial direction of the torsion bar 13. Similarly, the first magnetic circuit part 21 and the second magnetic circuit part 22 may be fixed to the second shaft 12 or may be fixed to the other end side in the axial direction of the torsion bar 13.

The case where the first magnetic circuit part 21 is disposed on the "one end side" in the axial direction of the multipolar magnet 20 does not mean that the first magnetic circuit part 21 is disposed only at the position corresponding to the one end in the axial direction of the multipolar magnet 20. Similarly, the case where the second magnetic circuit part 22 is disposed on the "other end side" in the axial direction of the multipolar magnet 20 does not mean that the second magnetic circuit part 22 is disposed only at the position corresponding to the other end in the axial direction of the multipolar magnet 20. That is, the above description merely defines the relative positional relationship between the first magnetic circuit part 21 and the second magnetic circuit part 22.

In other words, the case where the first magnetic circuit part 21 is disposed on the "one end side" in the axial direction of the multipolar magnet 20 and the second magnetic circuit part 22 is disposed on the "other end side" in the axial direction of the multipolar magnet 20 does not eliminate the case where the first magnetic circuit part 21 and the second magnetic circuit part 22 are partially disposed on the center in the axial direction of the multipolar magnet 20. Thus, for example, the first ring plate part 21b and the second ring plate part 22b may be opposed to each other with a narrow magnetic gap therebetween on substantially the center in the axial direction of the multipolar magnet 20. In this case, the torque detection device 10 is configured in such a manner that the magnetic induction element 47a is located inside the magnetic gap.

The extending position and/or the extending direction of the connector part 33 is not limited to the above concrete example. That is, for example, the connector part 33 may extend in the axial direction or the width direction from substantially the center in the projecting direction of the main body part 32. Alternatively, for example, the connector part 33 may extend in the width direction from the upper end of the main body part 32. Alternatively, for example, the connector part 33 may extend further upward (that is, in the Y-axis positive direction in the drawing) from the upper end of the main body part 32.

Figure 7:
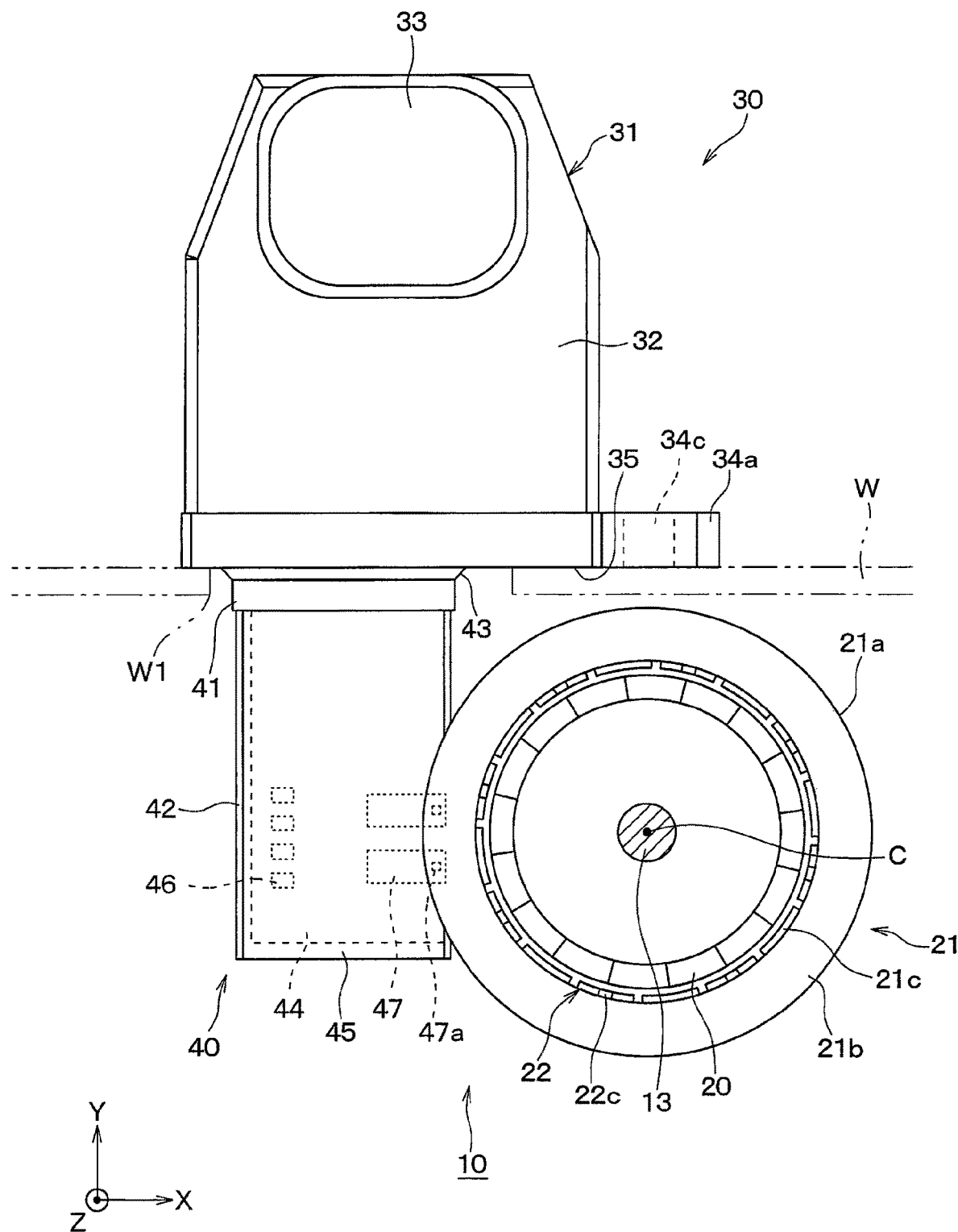
FIG. 7 is a plan view of a torque detection device of a first modification.

The first flange part 34a extends in the flange extending direction from the other end side toward the one end side in the width direction of the circuit board module 40. Thus, when viewed in the sensor arrangement direction, the first flange part 34a overlaps the first magnetic circuit part 21, the second magnetic circuit part 22, and the multipolar magnet 20. Further, when viewed in the sensor arrangement direction, the fixing hole 34c overlaps the first magnetic circuit part 21, the second magnetic circuit part 22, or the multipolar magnet 20. Thus, as illustrated in FIG. 7, the width-direction dimensions of the sensor module 30 and the torque detection device 10 can be reduced by eliminating the second flange part 34b illustrated in FIGS. 5 and 6.

Figure 8:
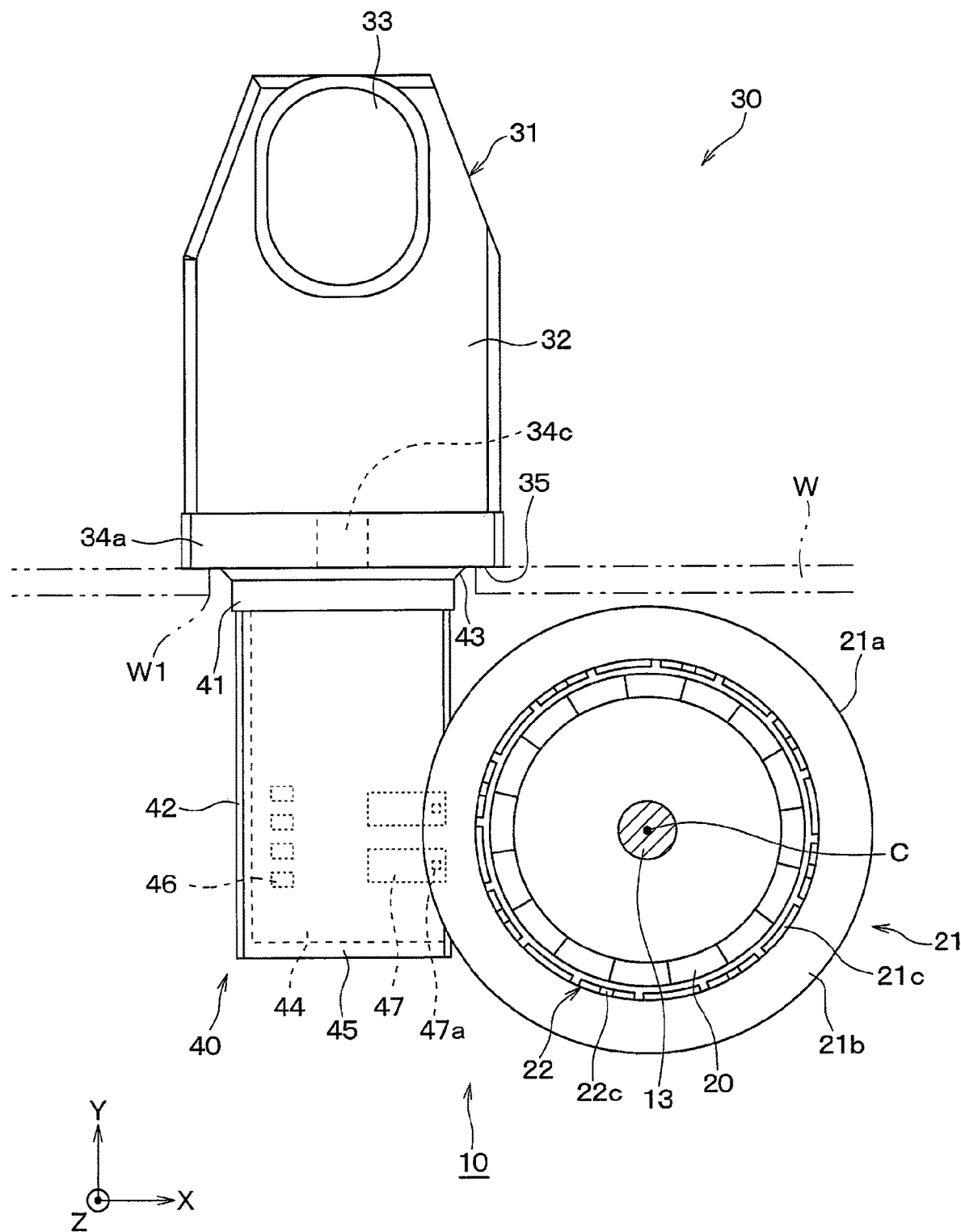
FIG. 8 is a plan view of a torque detection device of a second modification.

Alternatively, as illustrated in FIG. 8, when the first flange part 34a projects in the axial direction, the width-direction dimensions of the sensor module 30 and the torque detection device 10 can be further reduced. In the configuration of FIG. 8, a second flange part which projects to the side opposite to the first flange part 34a may be disposed in addition to the first flange part 34a.

In the above embodiment, the projecting direction which is parallel to the sensor arrangement direction in the circuit board module 40 is perpendicular to the width direction (that is, the flange extending direction) of the sensor housing 31. However, the present disclosure is not limited to such a mode.

Thus, the sensor arrangement direction, that is, the projecting direction may be a direction intersecting the flange extending direction. In this case, the circuit board module 40 may be rotated about the base end (that is, the upper end) by an angle θ3 from a state illustrated in FIG. 5. The angle θ3 satisfies 0 deg<θ3<90 deg, and preferably satisfies 5 deg≤θ3≤30 deg. Also in this case, the "width direction" of the circuit board module 40 can be defined as the direction perpendicular to the extending direction of the circuit board module 40. Thus, also in this case, the "width direction" of the circuit board module 40 is perpendicular to the sensor arrangement direction.

The circuit board module 40, that is, the circuit board 44 may be formed in a polygonal shape other than a rectangular shape. Also in this case, satisfactory downsizing of the sensor module 30 can be achieved by making the width-direction dimension in the coupling part with the sensor housing 31 smaller than the projecting dimension from the sensor housing 31.

Figure 9:
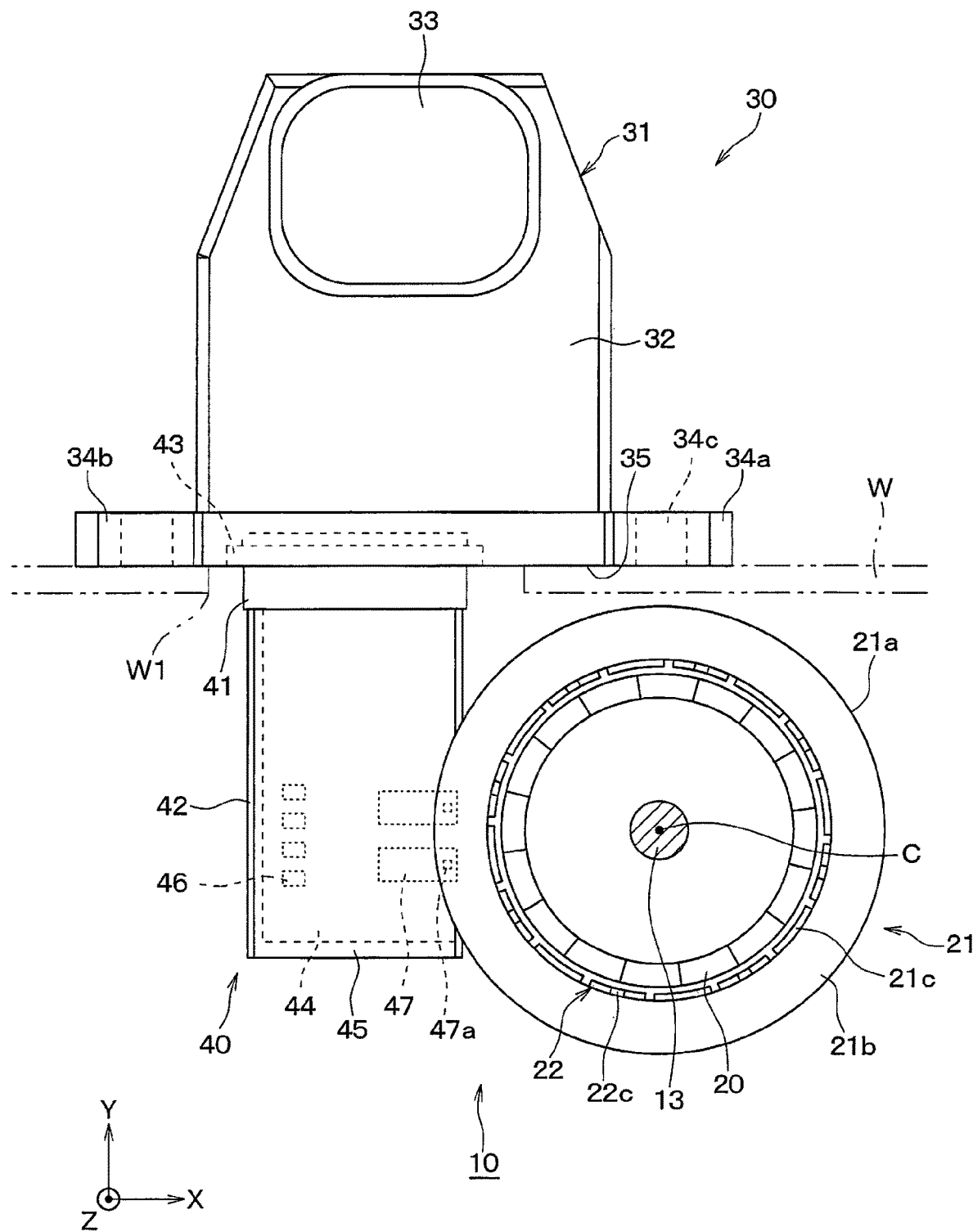
FIG. 9 is a plan view of a torque detection device of a third modification.

The configuration and the material of the waterproof seal member 43 are also not limited to the above concrete example. For example, as illustrated in FIG. 9, the waterproof seal member 43 may be buried in a groove formed on the end face 35 of the sensor housing 31. Alternatively, the waterproof seal member 43 may be a ready-made seal member such as an O-ring. Specifically, for example, the base part 41 may be inserted into a cylindrical hole formed on the main body part 32 of the sensor housing 31. In this case, the waterproof seal member 43 may be an O-ring or packing that is fitted with a groove formed on the columnar surface-shaped outer peripheral face of the base part 41. The ready-made seal member and a caulking agent may be used in combination.

The material of the covering member 45 is also not limited to the above concrete example. The magnetic sensors 47 each are not limited to a Hall IC. Three or more magnetic sensors 47 may be disposed. Also, there is no particular limitation on the mounting positions and/or the mounting number of circuit elements, other than the magnetic sensors 47, including a plurality of capacitors 46. That is, the circuit elements other than the magnetic sensors 47 may be disposed at a position other than the sensor mounting part 42 (e.g., on the base part 41 or inside the sensor housing 31).

Figure 10:
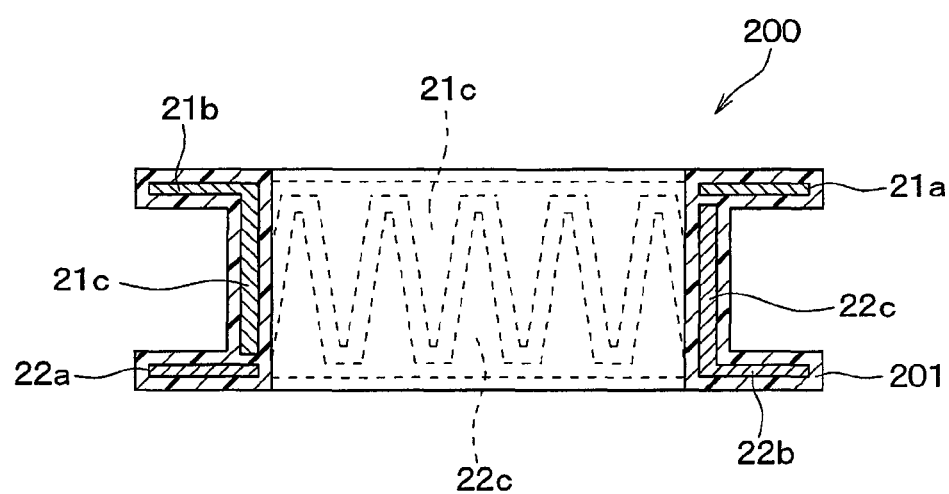
FIG. 10 is a side sectional view illustrating an example in which a first yoke member and a second yoke member illustrated in FIG. 2 are unitized.

As illustrated in FIG. 10, the first yoke member 21a and the second yoke member 22a may be integrated together as a yoke unit 200. The yoke unit 200 has a bobbin shape including ring-like flanges on both ends in the axial direction of a cylinder. The yoke unit 200 includes the first yoke member 21a and the second yoke member 22a which are opposed to each other in a predetermined positional relationship and a mold resin 201 which covers the outer side of the first yoke member 21a and the second yoke member 22a in the opposed state.

Figure 11:
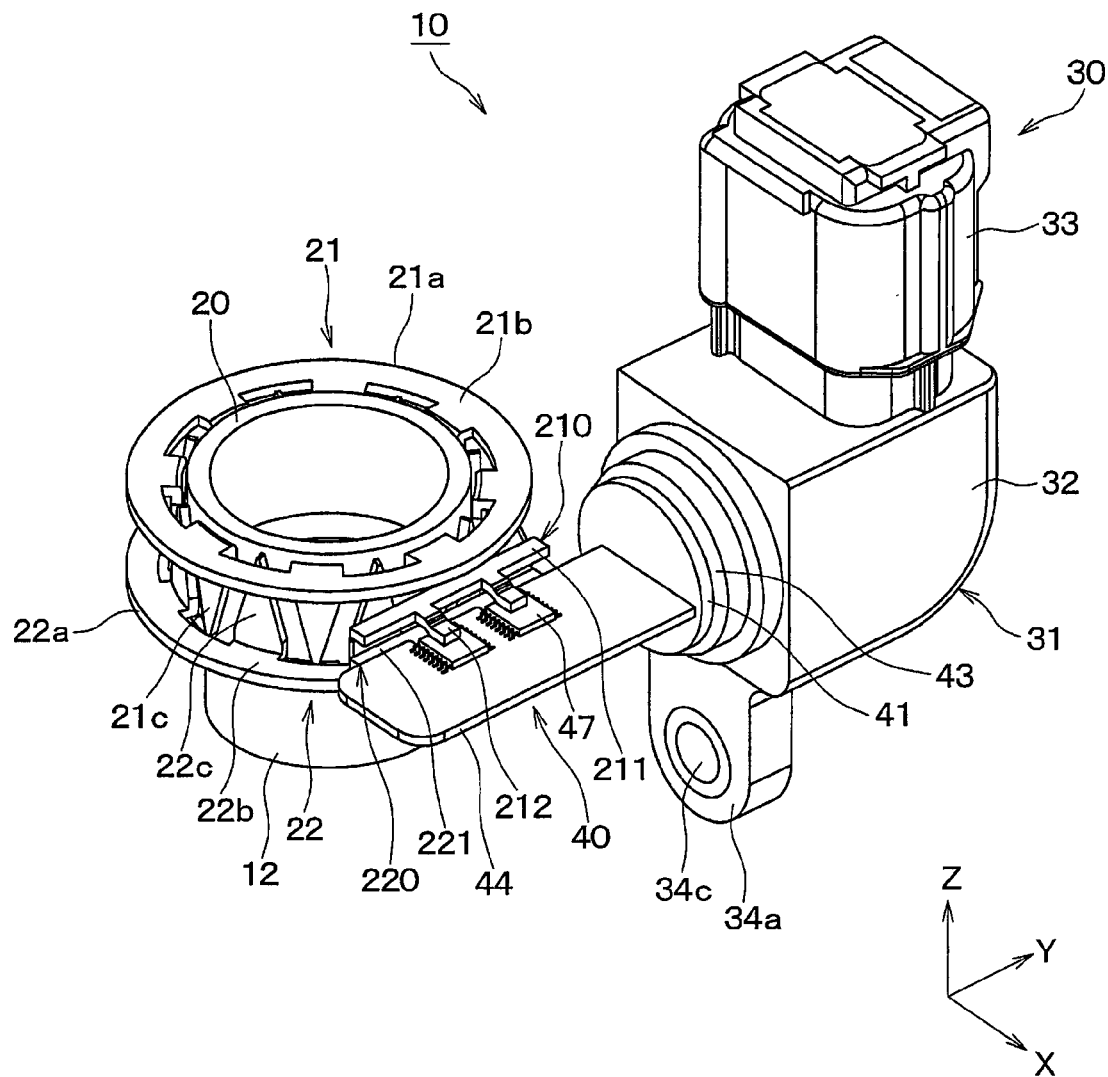
FIG. 11 is a perspective view of a torque detection device of a fourth modification.
Figure 12:
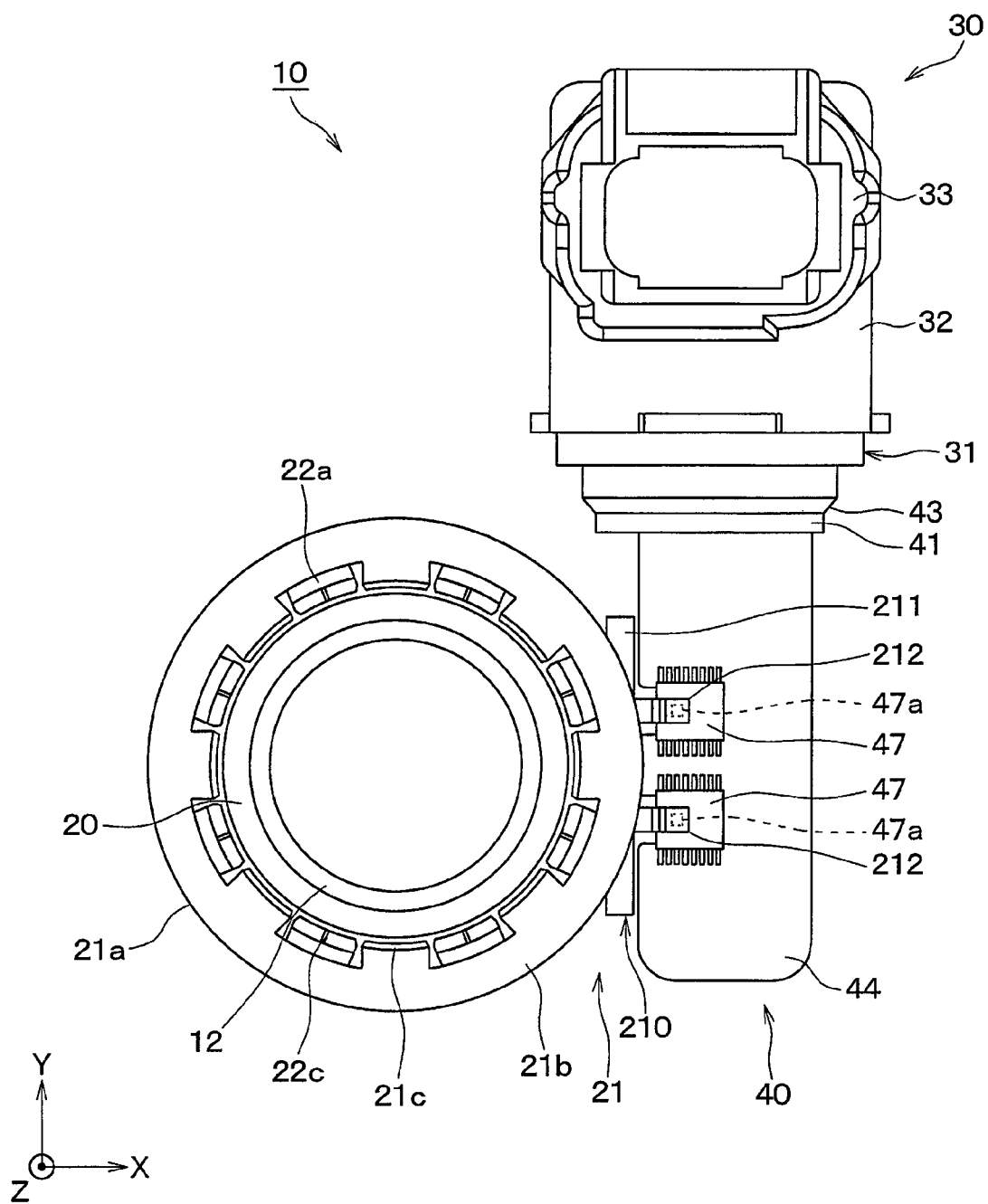
FIG. 12 is a plan view of the torque detection device illustrated in FIG. 11.
Figure 13:
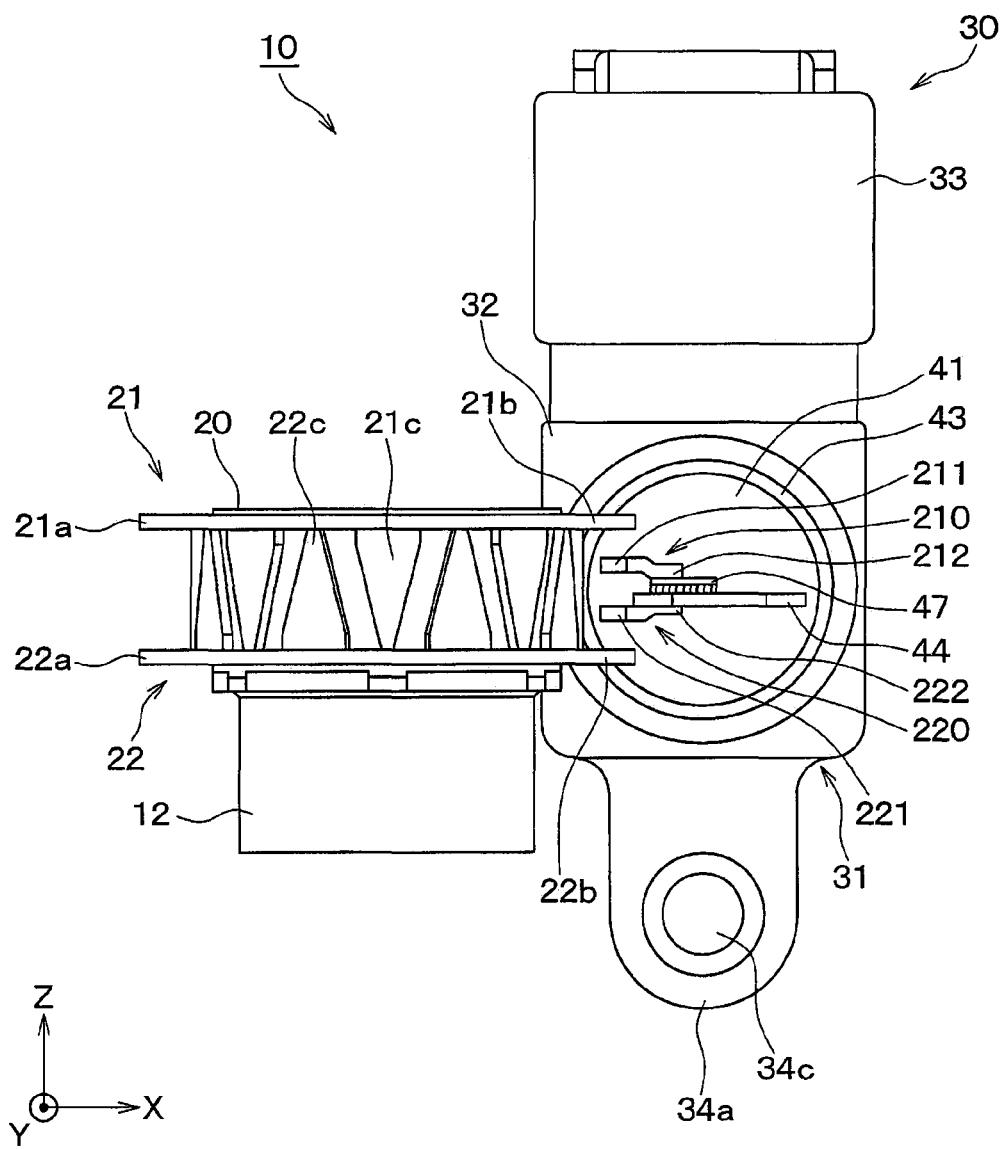
FIG. 13 is a side view of the torque detection device illustrated in FIG. 11.

Referring to FIGS. 11 to 13, the first magnetic circuit part 21 may further include a first magnetism collecting member 210. The first magnetism collecting member 210 is disposed close to the first yoke member 21a on the lower side relative to the first yoke member 21a so as to be magnetically coupled to the first yoke member 21a. Specifically, the first magnetism collecting member 210 includes a first main body part 211 and a plurality of first tongue piece parts 212.

The first main body part 211 is a bar-like part having a longitudinal direction along the projecting direction. The first main body part 211 is disposed in such a manner that its central part in the longitudinal direction is located directly below the first ring plate part 21b. Each of the plurality of the first tongue piece parts 212 is disposed directly above the corresponding one of the magnetic sensors 47. Each of the plurality of the first tongue piece parts 212 extends in the width direction from the first main body part 211 in plan view, away from the first ring plate part 21b. That is, each of the plurality of the first tongue piece parts 212 extends toward the corresponding one of the magnetic sensors 47.

Similarly, the second magnetic circuit part 22 may further include a second magnetism collecting member 220. The second magnetism collecting member 220 is disposed close to the second yoke member 22a on the upper side relative to the second yoke member 22a so as to be magnetically coupled to the second yoke member 22a. Specifically, the second magnetism collecting member 220 includes a second main body part 221 and a plurality of second tongue piece parts 222.

The second main body part 221 is a bar-like member having a longitudinal direction along the projecting direction. The second main body part 221 is disposed in such a manner that its central part in the longitudinal direction is located directly above the second ring plate part 22b. Each of the plurality of the second tongue piece parts 222 is disposed directly below the corresponding one of the magnetic sensors 47. Each of the plurality of the second tongue piece parts 222 extends in the width direction from the second main body part 221 in plan view away from the second ring plate part 22b. That is, each of the second tongue piece parts 222 extends toward the corresponding one of the magnetic sensors 47.

The first magnetism collecting member 210 and the second magnetism collecting member 220 are opposed to each other in the axial direction. Each of the plurality of the magnetic sensors 47 is disposed between the first magnetism collecting member 210 and the second magnetism collecting member 220 in such a manner that the magnetic induction element 47a is located inside a magnetic gap formed between the tip of the corresponding one of the first tongue piece parts 212 and the tip of the corresponding one of the second tongue piece parts 222.

In such a configuration, a step is formed between the first main body part 211 and each of the first tongue piece parts 212 to bring the first tongue piece part 212 close to each of the magnetic sensors 47 and a step is formed between the second main body part 221 and each of the second tongue piece parts 222 to bring the second tongue piece part 222 close to each of the magnetic sensors 47 to make the magnetic gap in which the magnetic induction element 47a is disposed small to the extent possible. Accordingly, the sensitivity of the torque detection device 10 is improved. Further, even when the positional relationship between the fixed magnetic circuit, which is formed by the first magnetic circuit part 21 and the second magnetic circuit part 22, and the sensor module 30 in the mounting/removal direction of the sensor module 30, that is, the projecting direction changes, the occurrence of a detection error can be satisfactorily prevented. Further, a whirling error, which occurs when the multipolar magnet 20 and the first yoke member 21a or the like relatively rotate in synchronization with each other, can be satisfactorily reduced.

Figure 14:
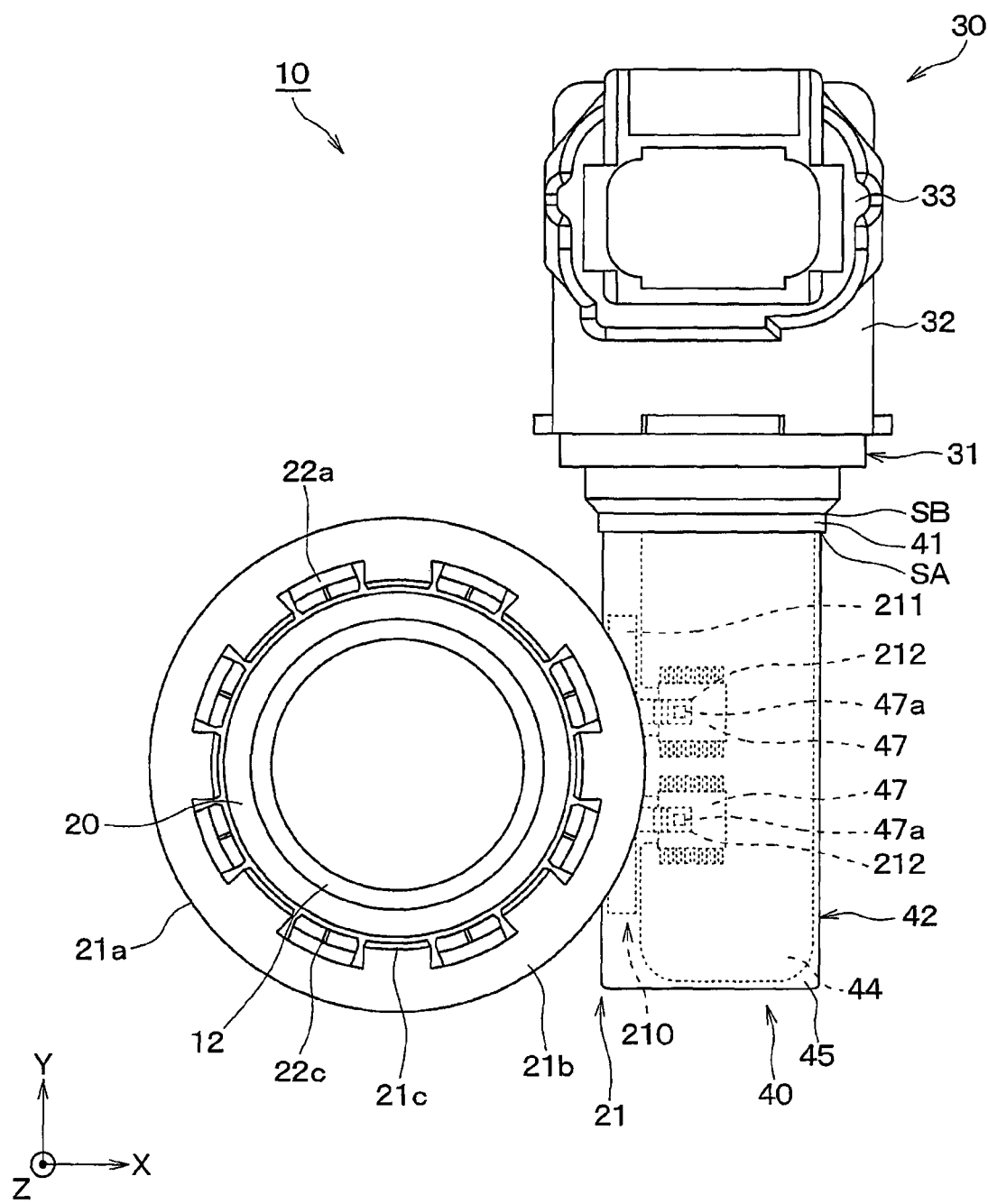
FIG. 14 is a plan view of a torque detection device of a fifth modification.
Figure 15:
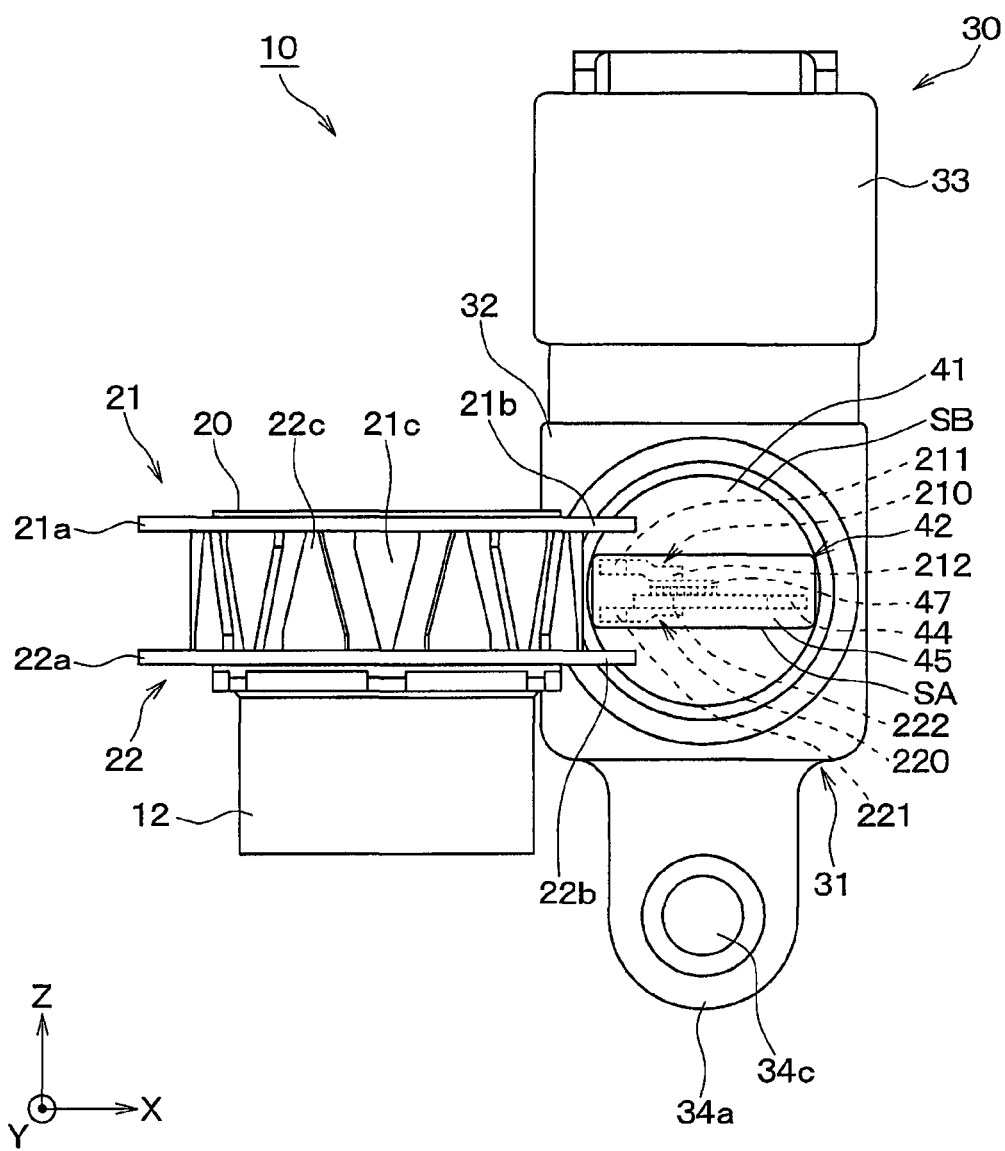
FIG. 15 is a side view of the torque detection device illustrated in FIG. 14.

The first magnetism collecting member 210 and the second magnetism collecting member 220 may be disposed separately from the sensor module 30. Alternatively, as illustrated in FIGS. 14 and 15, the first magnetism collecting member 210 and the second magnetism collecting member 220 may be integrated with the sensor mounting part 42. That is, the first magnetism collecting member 210 and the second magnetism collecting member 220 may be covered with the covering member 45. Specifically, in order to ensure the waterproofness in the sensor module 30, it is necessary to consider a waterproof structure in the circuit board module 40 in addition to the waterproof seal structure in the coupling part between the sensor housing 31 and the circuit board module 40. The waterproof seal structure in the coupling part between the sensor housing 31 and the circuit board module 40 will be described later. On the other hand, it is necessary for the waterproof structure in the circuit board module 40 to prevent a joint interface between different types of materials from being exposed on the surface of the covering member 45. In this point, in the configuration illustrated in FIGS. 14 and 15, the first magnetism collecting member 210 and the second magnetism collecting member 220 are completely over-molded together with the sensor mounting part 42 with the covering member 45 so that the joint interface between different types of materials is not exposed on the surface of the covering member 45. Further, the first magnetism collecting member 210 and the second magnetism collecting member 220 have a small shape so as to fit inside the circuit board 44 in plan view to enable the over-mold as described above. Thus, such a configuration makes it possible to satisfactorily achieve the waterproof structure in the circuit board module 40. Further, a step is formed between the first main body part 211 and each of the first tongue piece parts 212 to bring the first tongue piece part 212 close to each of the magnetic sensors 47 and a step is formed between the second main body part 221 and each of the second tongue piece parts 222 to bring the second tongue piece part 222 close to each of the magnetic sensors 47 to compensate an increase in the magnetic gap caused by the over-mold. Accordingly, an excellent sensitivity can be maintained.

Figure 16:
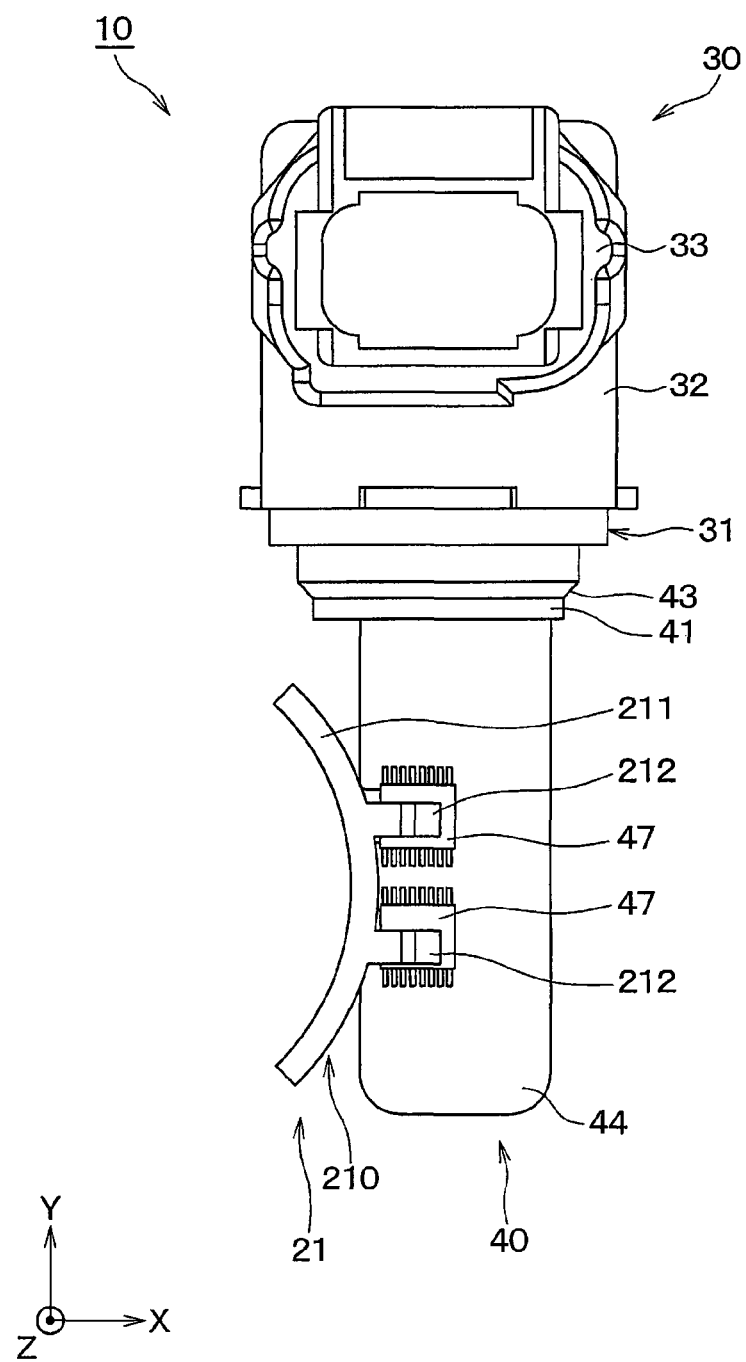
FIG. 16 is a plan view of a torque detection device of a sixth modification.

The shapes of the first magnetism collecting member 210 and the second magnetism collecting member 220 are not limited to the above concrete example. That is, for example, as illustrated in FIG. 16, the first main body part 211 of the first magnetism collecting member 210 may be formed in a circular arc shape concentric with the first yoke member 21a illustrated in FIG. 12 and the like. The same applies to the second magnetism collecting member 220. With such a configuration, the opposed area between the first magnetism collecting member 210 and the first yoke member 21a and the opposed area between the second magnetism collecting member 220 and the second yoke member 22a are increased to further increase the magnetic flux density induced in the first magnetism collecting member 210 and the second magnetism collecting member 220. Accordingly, the sensitivity of the torque detection device 10 is further improved.

As is obvious from the description of the embodiment and each of the modifications described above and the description of each drawing, in the embodiment and each of the modifications described above, the circuit board module 40 includes the magnetic sensors 47 mounted thereon and faces the gap between the first magnetic circuit part 21 and the second magnetic circuit part 22 on the one end side in the width direction which is included in the plane intersecting the axial direction and intersects the projecting direction. Thus, the rotation center axis C is not located ahead in the projecting direction of the circuit board module 40, that is, the circuit board 44. That is, the circuit board module 40 is disposed at a position offset from the multipolar magnet 20, the first magnetic circuit part 21, and the second magnetic circuit part 22 in the width direction which is perpendicular to the axial direction and the projecting direction.

The employment of such an offset structure makes it possible to satisfactorily ensure the circuit mounting area in the circuit board 44 which projects from the sensor housing 31. That is, all or most of a plurality of circuit elements required for torque detection can be mounted on the circuit board 44 which is disposed outside the sensor housing 31. Thus, it is sufficient that a wiring part that connects the circuit board 44 to the connector part 33 be disposed on the main body part 32 of the sensor housing 31. Thus, such an offset structure makes it possible to reduce the dimension of the sensor housing 31 to the extent possible. Further, in such an offset structure, downsizing of the body of the torque detection device 10 in the radial direction is satisfactorily achieved. That is, in such an offset structure, the projecting-direction dimension of the entire torque detection device 10 including the first magnetic circuit part 21, the second magnetic circuit part 22, and the sensor module 30 is smaller than that in a "non-offset structure" in which the rotation center axis C is located ahead in the projecting direction of the circuit board 44. Accordingly, the vehicle mountability of the torque detection device 10 is improved as compared to the non-offset structure. These effects are similarly obtained also when only one magnetic sensor 47 is mounted.

The waterproof seal structure in the coupling part between the sensor housing 31 and the circuit board module 40 is not limited to the above concrete example. Hereinbelow, a modification relating to the waterproof seal structure will be described.

For example, referring to FIGS. 14 and 15, the base part 41 and the covering member 45 included in the sensor mounting part 42 may be integrally molded by insert molding or the like. In this case, waterproof sealing using a seal member is not required in a first seal site SA which is a coupling site between the base part 41 and the sensor mounting part 42. Thus, in this case, the waterproof sealing using the seal member as described above is performed on a second seal site SB which is a coupling site between the sensor housing 31 and the base part 41.

On the other hand, the sensor mounting part 42 may be coupled to the base part 41 after the base part 41 and the covering member 45 included in the sensor mounting part 42 are separately molded. Alternatively, the base part 41 may be disposed on the main body part 32 of the sensor housing 31. In these cases, the waterproof sealing using the seal member as described above is performed on the first seal site SA.

Also in these cases, in the present disclosure, it is possible to reduce the width-direction dimension of the sensor mounting part 42 by setting the sensor arrangement direction substantially parallel to the projecting direction. Thus, the seal length in the first seal site SA can be reduced to the extent possible. Thus, such a configuration makes it possible to achieve an excellent waterproof performance with a simple waterproof seal structure.

The base part 41 may be eliminated.

The waterproof seal member 43 may be eliminated when the coupling part between the sensor housing 31 and the circuit board module 40 has a direct joint structure between synthetic resins. Specifically, for example, referring to FIGS. 14 and 15, the sensor housing 31 is formed by insert molding or the like on the base end of the circuit board module 40 on which the covering member 45 is molded of a synthetic resin. Accordingly, the base end of the circuit board module 40 and the sensor housing 31 may be directly joined together. The direct joining between the base end of the circuit board module 40 and the sensor housing 31 can also be achieved by welding including laser welding in addition to the insert molding.

The covering structure by the covering member 45 of the circuit board module 40 is not limited to a so-called overmold structure in which the covering member 45 adheres closely to an object to be covered to cover the entire object. That is, the covering member 45 may not adhere closely to the circuit element such as the magnetic sensor 47 as long as the waterproof structure in the circuit board module 40 is achieved. Specifically, for example, the covering member 45 may be a synthetic resin case that covers the circuit board 44. That is, it is sufficient that the covering member 45 cover an object to be covered so that the object is not exposed in a state in which the sensor housing 31 and the circuit board module 40 are coupled together by the waterproof seal structure.

In other words, when the joint interface between the synthetic resin material of the covering member 45 and the object to be covered is not exposed on the surface of the covering member 45 in a state in which the sensor housing 31 and the circuit board module 40 are coupled together by the waterproof seal structure, the waterproof structure can be achieved. The object to be covered includes the circuit board 44, the circuit elements mounted on the circuit board 44, and a wiring material connected to the circuit board 44. The wiring material is, for example, a terminal, a lead, or the like.

In the embodiment and each of the modifications described above, a so-called "waterproof connector" can be used as the connector part 33. In particular, "perfect waterproofing" in the torque detection device 10 is achieved by the waterproof seal structure in the coupling part between the sensor housing 31 and the circuit board module 40, the waterproof structure in the circuit board module 40, and the waterproof connector used as the connector part 33 as described above. Such a perfect waterproof structure is important particularly when there is a possibility that the torque detection device 10 is exposed to a heavy wet environment.

Figure 17:
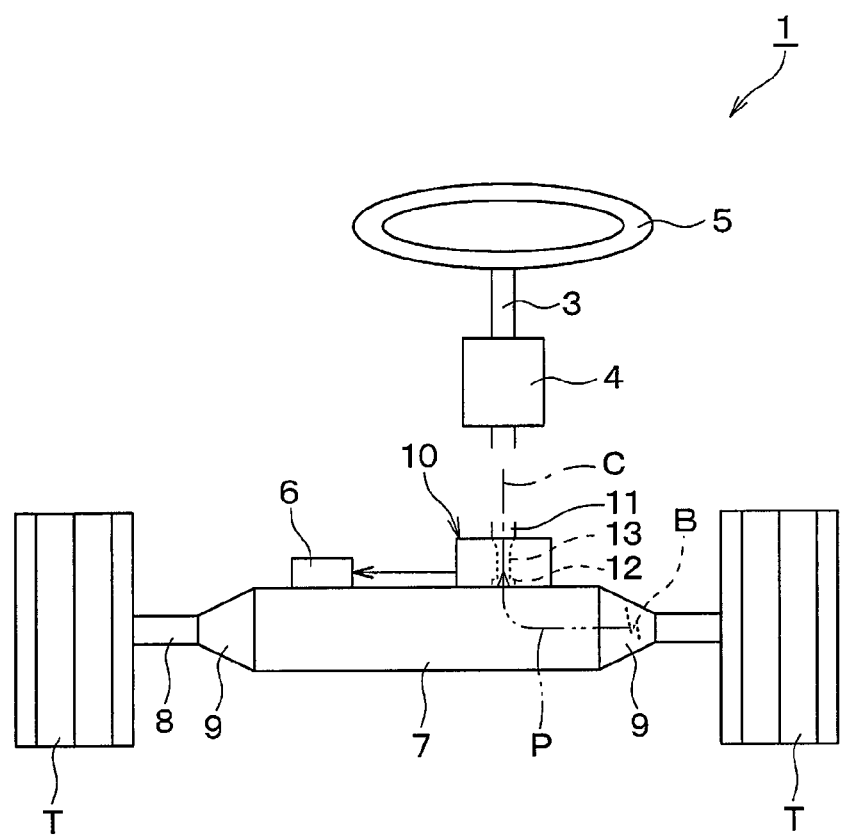
FIG. 17 is a schematic configuration diagram of a rack type electric power steering apparatus.

That is, the structure of the electric power steering apparatus 1 includes a so-called "rack type" illustrated in FIG. 17 in addition to a so-called "column type" illustrated in FIG. 1. Specifically, referring to FIG. 17, the rack type electric power steering apparatus 1 includes a steering shaft 3, a steering column 4, a steering wheel 5, an electric motor 6, a steering gear mechanism 7, a link mechanism 8, a rubber boot 9, and a torque detection device 10. Although the steering shaft 3, the steering column 4, and the rubber boot 9 are also included in the column type electric power steering apparatus 1 illustrated in FIG. 1, these members are not designated by a reference sign or not illustrated in FIG. 1.

The steering shaft 3 is rotatably supported by the steering column 4. One end of the steering shaft 3 is coupled to the steering wheel 5. The steering shaft 3 rotates in accordance with the operation of the steering wheel 5.

The electric motor 6 is driven in accordance with an operating state of the steering wheel 5 to input an assist force that assists a steering force for changing the direction of a wheel T to the steering gear mechanism 7. As illustrated in FIG. 17, in the rack type electric power steering apparatus 1, the electric motor 6 is mounted on a casing of the steering gear mechanism 7. On the other hand, in the columnar type electric power steering apparatus 1 illustrated in FIG. 1, the electric motor 6 is mounted on the steering column 4.

The rubber boot 9 is mounted on a coupling site with the link mechanism 8 on each end of the steering gear mechanism 7. The rubber boot 9 is disposed to prevent water from entering inside the steering gear mechanism 7 through the coupling site between the steering gear mechanism 7 and the link mechanism 8.

As illustrated in FIG. 17, in the rack type electric power steering apparatus 1, the torque detection device 10 is mounted on the casing of the steering gear mechanism 7. On the other hand, in the column type electric power steering apparatus 1 illustrated in FIG. 1, the torque detection device 10 is mounted on the steering column 4. That is, in the column type electric power steering apparatus 1 illustrated in FIG. 1, the housing wall W is a wall member that constitutes the casing of the steering column 4. On the other hand, in the rack type electric power steering apparatus 1 illustrated in FIG. 17, the housing wall W is a wall member that constitutes the casing of the steering gear mechanism 7.

There is a possibility that water enters inside the rubber boot 9 due to deterioration or breakage of the rubber boot 9. In this point, in the column type electric power steering apparatus 1 illustrated in FIG. 1, there is a low possibility that water that has entered inside the rubber boot 9 flows upstream up to the torque detection device 10 against gravity. Thus, in the column type electric power steering apparatus 1 illustrated in FIG. 1, wetting of the torque detection device 10 is only caused by water entering through the joint between the sensor housing 31 and the housing wall W, and a wetting environment may be relatively light.

On the other hand, in the rack type electric power steering apparatus 1 illustrated in FIG. 17, the torque detection device 10 is disposed at a mounting height similar to the rubber boot 9 and located near a water intrusion site where water enters inside the steering gear mechanism 7 from the rubber boot 9. Thus, even when the joint between the sensor module 30 and the housing wall W is waterproof-sealed with an O-ring or the like as an anti-wetting measure, water that has entered through a crack B formed in the rubber boot 9 passes through a water intrusion path P inside the casing of the steering gear mechanism 7 and enters inside the housing wall W. In this case, there is a possibility that the circuit board module 40 and the coupling part between the sensor housing 31 and the circuit board module 40 are exposed to water that has entered inside the housing wall W. If a circuit failure occurs due to water that has entered inside the torque detection device 10, output of a torque detection signal is stopped due to the circuit failure. Thus, there is a concern that the operation of the electric power steering apparatus 1 is stopped. However, when the torque detection device 10, that is, the sensor module 30 has the perfect waterproof structure in which the joint interface between different types of materials is not exposed to the water intrusion path P as described above, the intrusion of water into the sensor module 30 can be satisfactorily prevented, and the operation of the electric power steering apparatus 1 can be satisfactorily continued even when an accidental boot breakage occurs.

The effect obtained by the above waterproof structure can be similarly obtained not only when a plurality of magnetic sensors 47 is mounted, but also when one magnetic sensor 47 is mounted. Further, a structure in which this effect can be obtained is not limited to the offset structure. That is, the effect can also be obtained in a similar manner also in a non-offset structure in which the rotation center axis C is located ahead in the projecting direction of the circuit board 44. That is, the waterproof structure as described above is effective not only in the offset structure, but also in the torque detection device 10 that does not have the offset structure.

Figure 18:
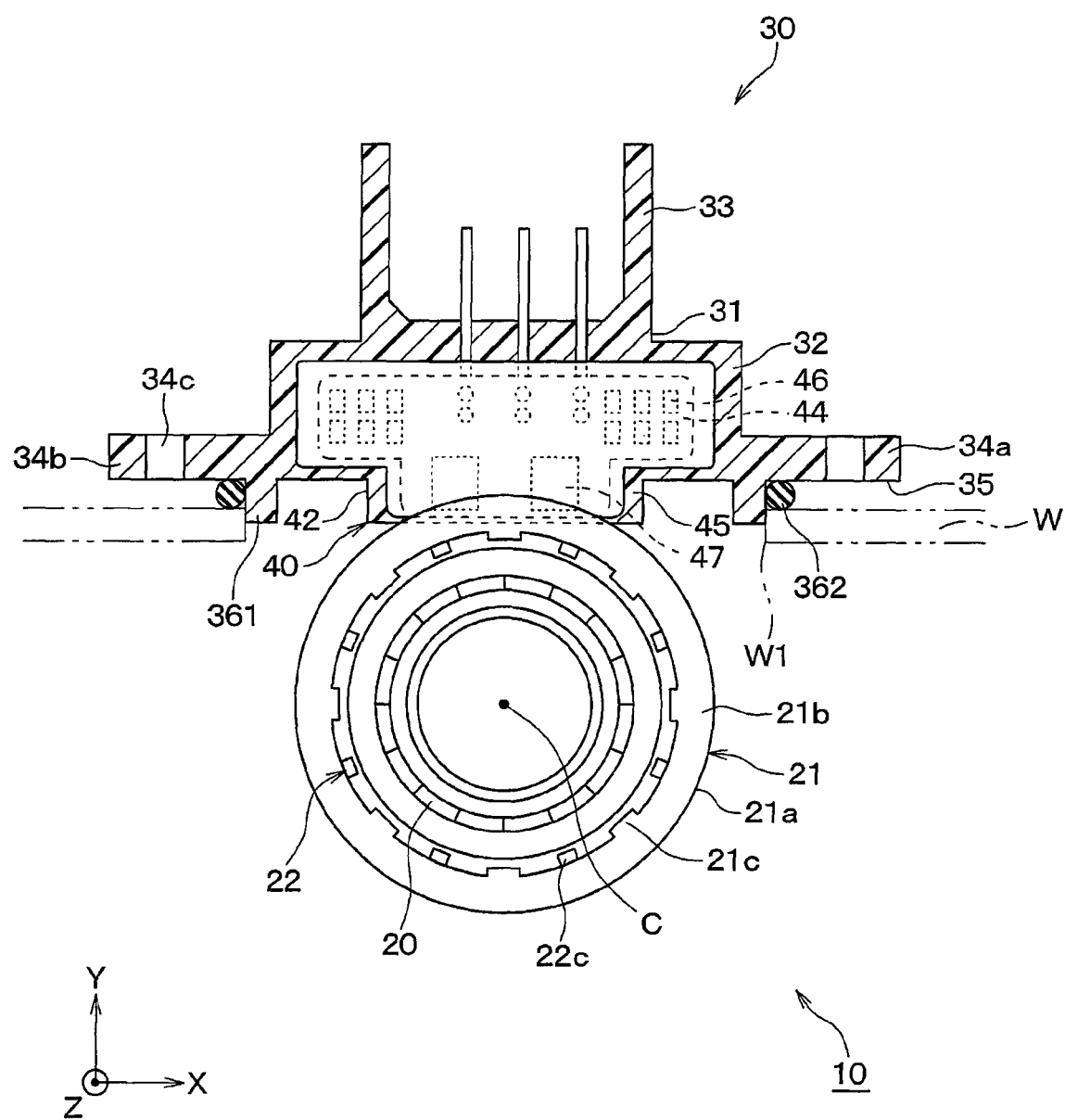
FIG. 18 is a plan view of a torque detection device of a seventh modification.
Figure 19:
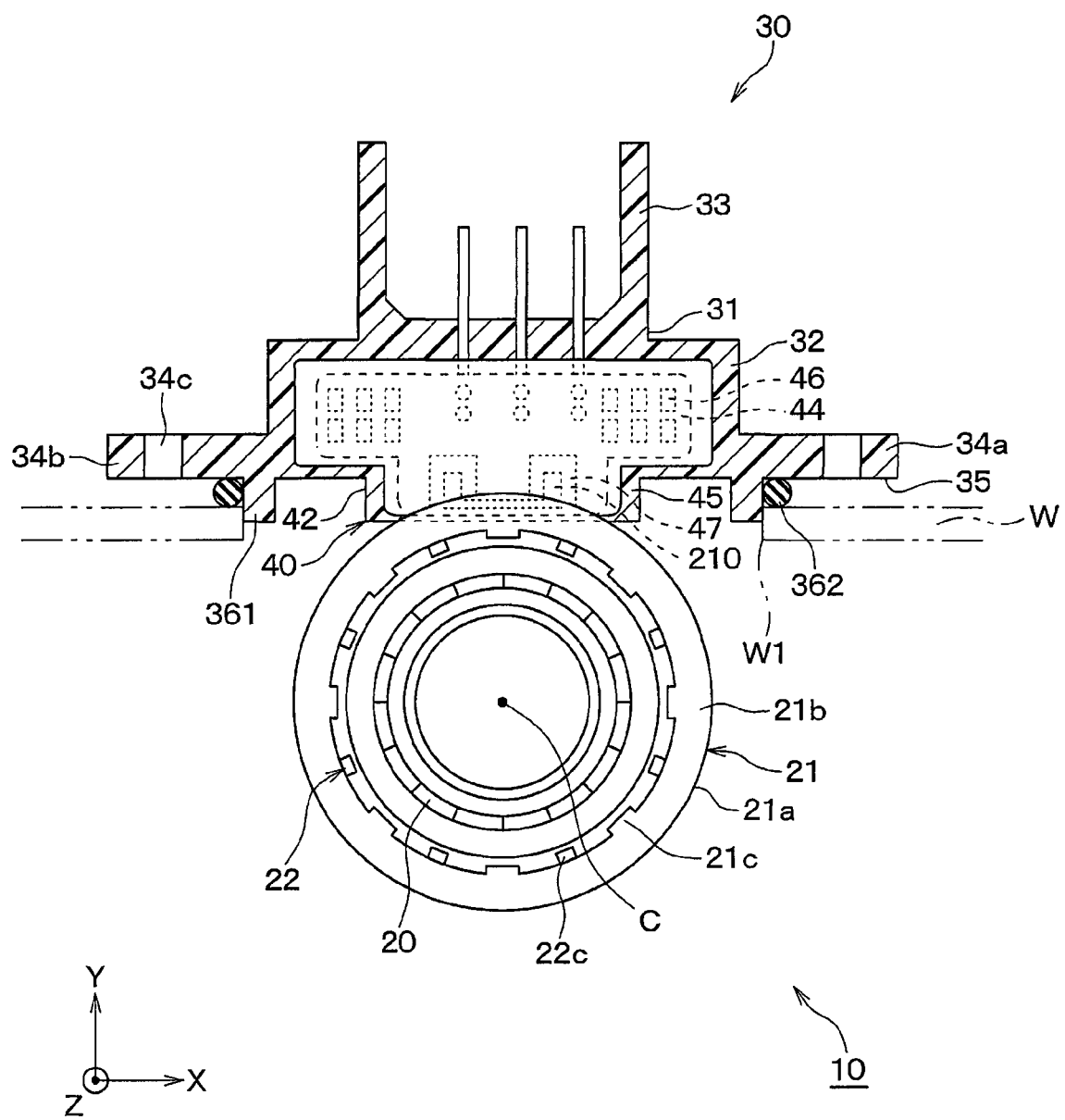
FIG. 19 is a plan view of a torque detection device of an eighth modification.

FIGS. 18 and 19 illustrate an example in which the torque detection device 10 has a perfect waterproof structure in the non-offset structure. In FIG. 19, a configuration in which the first magnetism collecting member 210 and the second magnetism collecting member 220 are covered with the covering member 45 in a manner similar to the example of FIGS. 14 and 15 is added to the configuration of FIG. 18.

The joint between the sensor module 30 and the housing wall W is preferably liquid-tightly joined together with a waterproof seal. Specifically, referring to FIGS. 18 and 19, the sensor housing 31 includes a tubular projection 361. The tubular projection 361 is formed integrally with the main body part 32 with no seam.

The tubular projection 361 is a rib-like projection having a cylindrical shape whose central axis is parallel to the projecting direction and projects in the projecting direction from the end face 35. The tubular projection 361 is fitted with the mounting hole W1 which is a circular hole. That is, the tubular projection 361 is formed in such a manner that the outer diameter dimension of the tubular projection 361 has a predetermined fit tolerance relationship with the inner diameter dimension of the mounting hole W1.

The tubular projection 361 has a projecting dimension higher than the thickness in a part of the housing wall W where the mounting hole W1 is formed. An O-ring 362 made of synthetic rubber is attached to the outer peripheral face of the tubular projection 361. That is, the O-ring 362 surrounds the coupling part between the sensor housing 31 and the circuit board module 40. In the present concrete example, the O-ring 362 is held while being pressed in the projecting direction between the end face 35 of the sensor housing 31 and the housing wall W.

Figure 20:
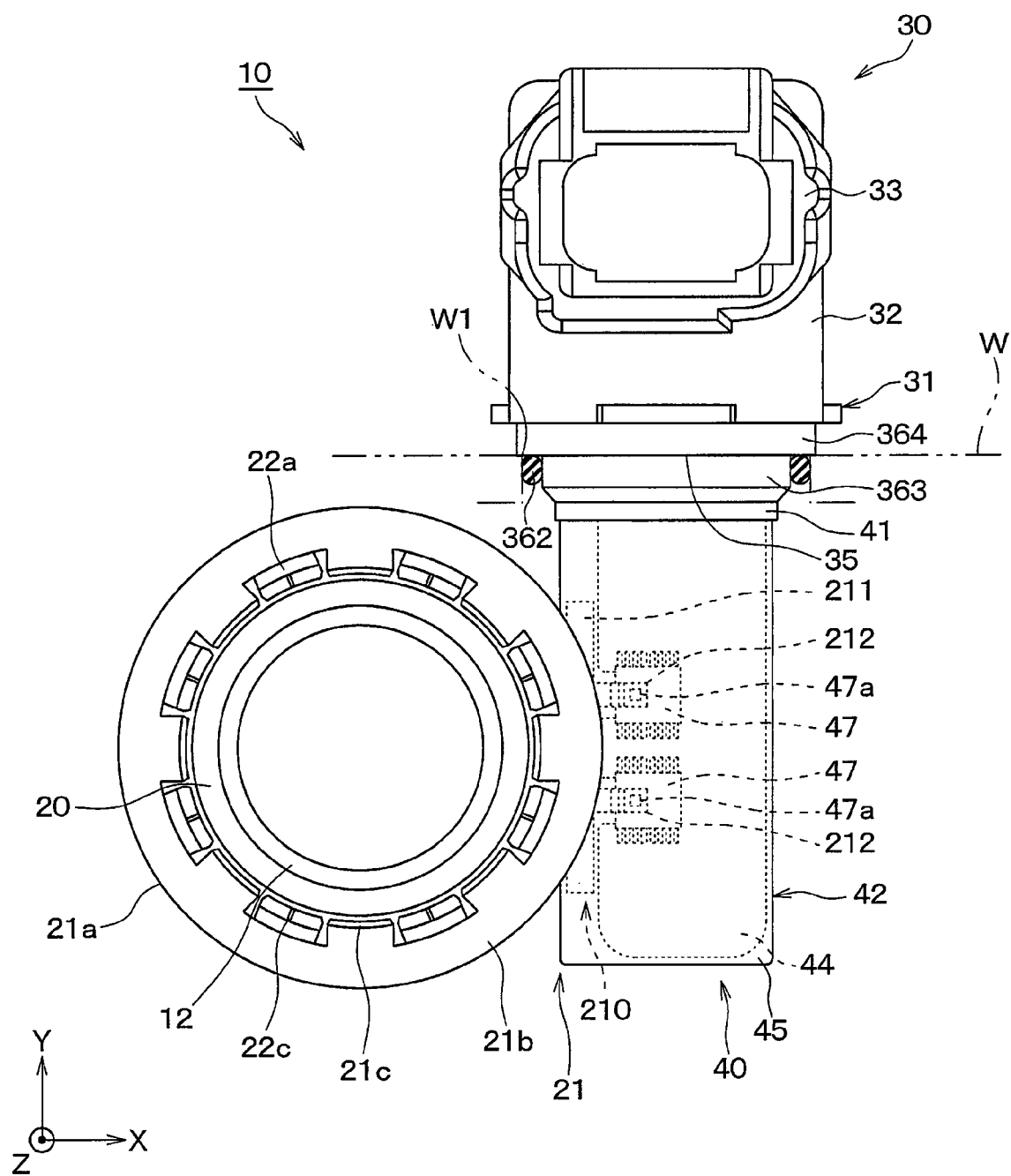
FIG. 20 is a plan view of a torque detection device of a ninth modification.

In such a configuration, it is not necessary to release the coupling between the first shaft 11, the second shaft 12, and the torsion bar 13 in mounting and removal of the sensor module 30. Thus, the sensor module 30 is easily replaced without releasing the coupling between the first shaft 11, the second shaft 12, and the torsion bar 13. In particular, the sensor housing 31 and the housing wall W are more reliably liquid-tightly joined together by attaching the O-ring 362 so as to be pressed in the ring radial direction. Such a seal structure is referred to as an "axial seal structure" in the present specification. FIG. 20 illustrates a concrete example of such a configuration.

The torque detection device 10 illustrated in FIG. 20 has a configuration similar to the configuration of the torque detection device 10 illustrated in FIGS. 14 and 15. In the present concrete example, the sensor housing 31 includes a first seal holding part 363 and a second seal holding part 364.

The first seal holding part 363 is a columnar part disposed in the coupling part between the sensor housing 31 and the circuit board module 40, and projects in the projecting direction from the end face 35 of the sensor housing 31. The first seal holding part 363 has an outer diameter capable of holding the O-ring 362 attached thereto, that is, an outer diameter slightly larger than the inner diameter of the O-ring 362 in a natural state. The "natural state" of the O-ring 362 indicates a state in which no external force other than gravity and antigravity from a horizontal surface acts on the O-ring 362 placed on the horizontal surface. The second seal holding part 364 is a part adjacent to the first seal holding part 363 in the projecting direction, and the surface of the second seal holding part 364 on the projection direction side, that is, on the extending direction side of the circuit board module 40 constitutes the end face 35. The second seal holding part 364 abuts on the O-ring 362 and the housing wall W on the end face on the projecting direction side, the end face constituting the end face 35, in a state in which the sensor module 30 is mounted on the housing wall W. That is, the first seal holding part 363 and the second seal holding part 364 form a step capable of holding the O-ring 362.

The O-ring 362 is held by the first seal holding part 363 in such a manner that the inner peripheral face of the O-ring 362 is in intimate contact with the columnar surface-shaped outer peripheral face of the first seal holding part 363. That is, the O-ring 362 surrounds the coupling part between the sensor housing 31 and the circuit board module 40.

The mounting hole W1 of the housing wall W is formed in a circular hole shape having a columnar surface-shaped inner peripheral face. Specifically, the mounting hole W1 is formed in such a manner that, when the sensor module 30 with the O-ring 362 unattached is mounted on the housing wall W, a gap slightly smaller than the thickness of the O-ring 362 is formed between the columnar surface-shaped outer peripheral face of the first seal holding part 363 and the inner peripheral face of the mounting hole W1.

In such a configuration, the O-ring 362 is pressed in the ring radial direction which intersects the projecting direction between the columnar surface-shaped outer peripheral face of the first seal holding part 363 and the inner peripheral face of the mounting hole W1. Accordingly, the sensor housing 31 and the housing wall W can be more reliably liquid-tightly joined together.

In such a configuration, the circuit board module 40 includes the magnetic sensors 47 mounted thereon and faces the gap between the first magnetic circuit part 21 and the second magnetic circuit part 22 on the one end side in the width direction which is included in the plane intersecting the axial direction and intersects the projecting direction. That is, the torque detection device 10 has the offset structure described above. Thus, the circuit board 44 may be formed in a vertically long shape having a longitudinal direction along the projecting direction. The outer diameter of the O-ring 362 can be made smaller than that in the horizontally long shape illustrated in FIGS. 18 and 19 by forming the circuit board 44 into the vertically long shape.

Thus, such a configuration makes it possible to easily achieve the axial seal structure and improve the sealability in the axial seal structure. In particular, the "perfect waterproofing" in the torque detection device 10 is satisfactorily achieved by the waterproof structure of the circuit board module 40 by over-mold and the waterproof connector used as the connector part 33.

FIGS. 21 to 24 illustrate a more concrete example of the configuration of the torque detection device 10 illustrated in FIG. 20. The torque detection device 10 of the present concrete example is configured to be mounted on the casing of the steering gear mechanism 7 in the rack type electric power steering apparatus 1 illustrated in FIG. 17. Hereinbelow, the specific configuration of the torque detection device 10 of the present concrete example will be described with reference to FIGS. 21 to 24.

The torque detection device 10 of the present concrete example includes a main housing 700. The main housing 700 is configured to house the multipolar magnet 20, the first magnetic circuit part 21, and the second magnetic circuit part 22 therein. Further, the main housing 700 is configured in such a manner that the sensor module 30 is mountable on and removable from the main housing 700. The case where the sensor module 30 is "mountable on and removable from" the main housing 700 means that the sensor module 30 can be easily mounted on and removed from the main housing 700 within a relatively short time by attaching or detaching a small number of screws, for example, approximately one to several screws. Thus, "mountable and removable" can also be referred to as "easily mountable and removable" or "freely mountable and removable".

The main housing 700 includes a magnetic circuit housing part 701, a sensor module housing part 702, and a joint flange part 703. The magnetic circuit housing part 701, the sensor module housing part 702, and the joint flange part 703 are formed integrally with each other with no seam.

The magnetic circuit housing part 701 is a part in which the multipolar magnet 20, the first magnetic circuit part 21, and the second magnetic circuit part 22 are housed, and formed in a substantially cylindrical shape extending in the axial direction. The sensor module housing part 702 is connected to one end in the width direction of the magnetic circuit housing part 701.

The sensor module housing part 702 is a part in which the circuit board module 40 is housed, and formed in a substantially cylindrical shape extending in the projecting direction. That is, the mounting hole W1 is formed on one end side in the projecting direction of the sensor module housing part 702. On the other hand, the other end side in the projecting direction of the sensor module housing part 702 is closed.

The outer diameter of the sensor module housing part 702 is smaller than the outer diameter of the magnetic circuit housing part 701. Further, the projecting-direction dimension of the sensor module housing part 702 is set smaller than the outer diameter of the magnetic circuit housing part 701. A sensor housing space W2 which is a substantially columnar space inside the sensor module housing part 702 communicates with a substantially columnar space inside the magnetic circuit housing part 701 in the width direction.

The joint flange part 703 is a flange part disposed on one end in the axial direction of the main housing 700, and extends in the in-plane direction. The joint flange part 703 is provided with a pair of fixing tongue piece parts 704. Each of the fixing tongue piece parts 704 extends in the width direction. A through hole 705 is formed on each of the fixing tongue piece parts 704. That is, the main housing 700 is liquid-tightly joined to the casing of the steering gear mechanism 7 by causing bolts (not illustrated) to pass through the through holes 705 and screwing the bolts with the casing of the steering gear mechanism 7 with a seal member such as a gasket held between the surface of the casing of the steering gear mechanism 7 and the joint flange part 703.

The housing wall W on which the sensor module 30 is mounted extends in the axial direction and the width direction on one end side in the projecting direction of the magnetic circuit housing part 701 and the sensor module housing part 702. The mounting hole W1 formed on the housing wall W communicates with the sensor housing space W2. That is, the mounting hole W1 is open on a mounting surface W3 which is the surface of the housing wall W and to which the sensor housing 31 is joined. Further, the mounting surface W3 includes a fastening hole W4 which is a screw hole communicating with the fixing hole 34c. That is, the sensor module 30 is mounted on the mounting surface W3 by causing a bolt (not illustrated) to pass through the fixing hole 34c and screwing the bolt with the fastening hole W4.

An opening of the mounting hole W1 includes an axial seal surface W11 and a facing surface W12. The axial seal surface W11 is formed in a cylindrical inner surface shape having a central axis direction parallel to the projecting direction. The axial seal surface W11 faces the first seal holding part 363 with the O-ring 362 interposed therebetween when the sensor module 30 is mounted on the main housing 700.

The facing surface W12 is substantially perpendicular to the axial seal surface W11 on one end in the projecting direction of the axial seal surface W11. The facing surface W12 is a planar part having a normal direction along the projecting direction and formed in a ring-like shape surrounding the central axis of the substantially columnar shape of the sensor housing space W2. That is, the axial seal surface W11 and the facing surface W12 form a step capable of holding the O-ring 362.

Figure 21:
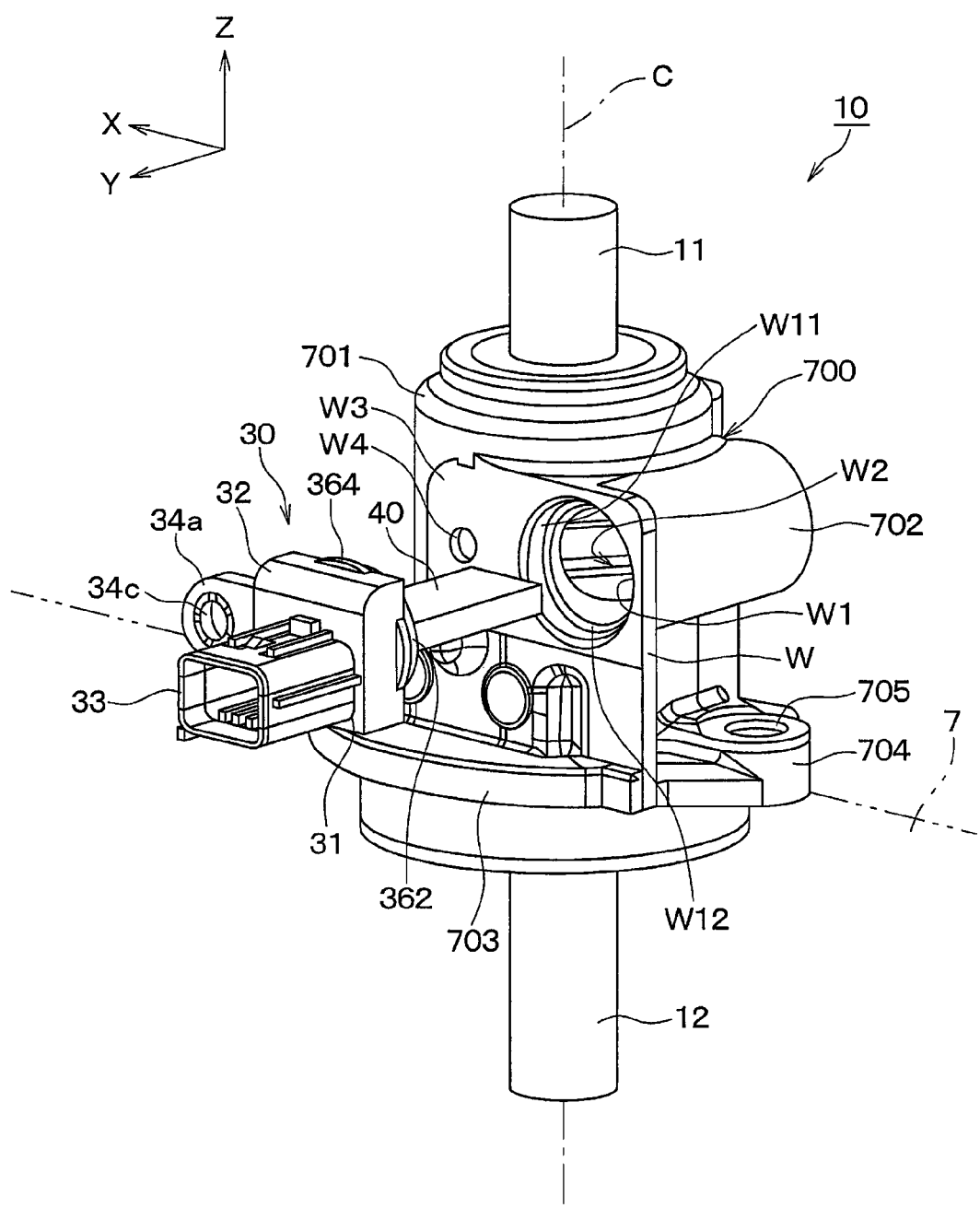
FIG. 21 is a perspective view illustrating the configuration of a tenth modification which is a concrete example of the torque detection device illustrated in FIG. 20.
Figure 22:
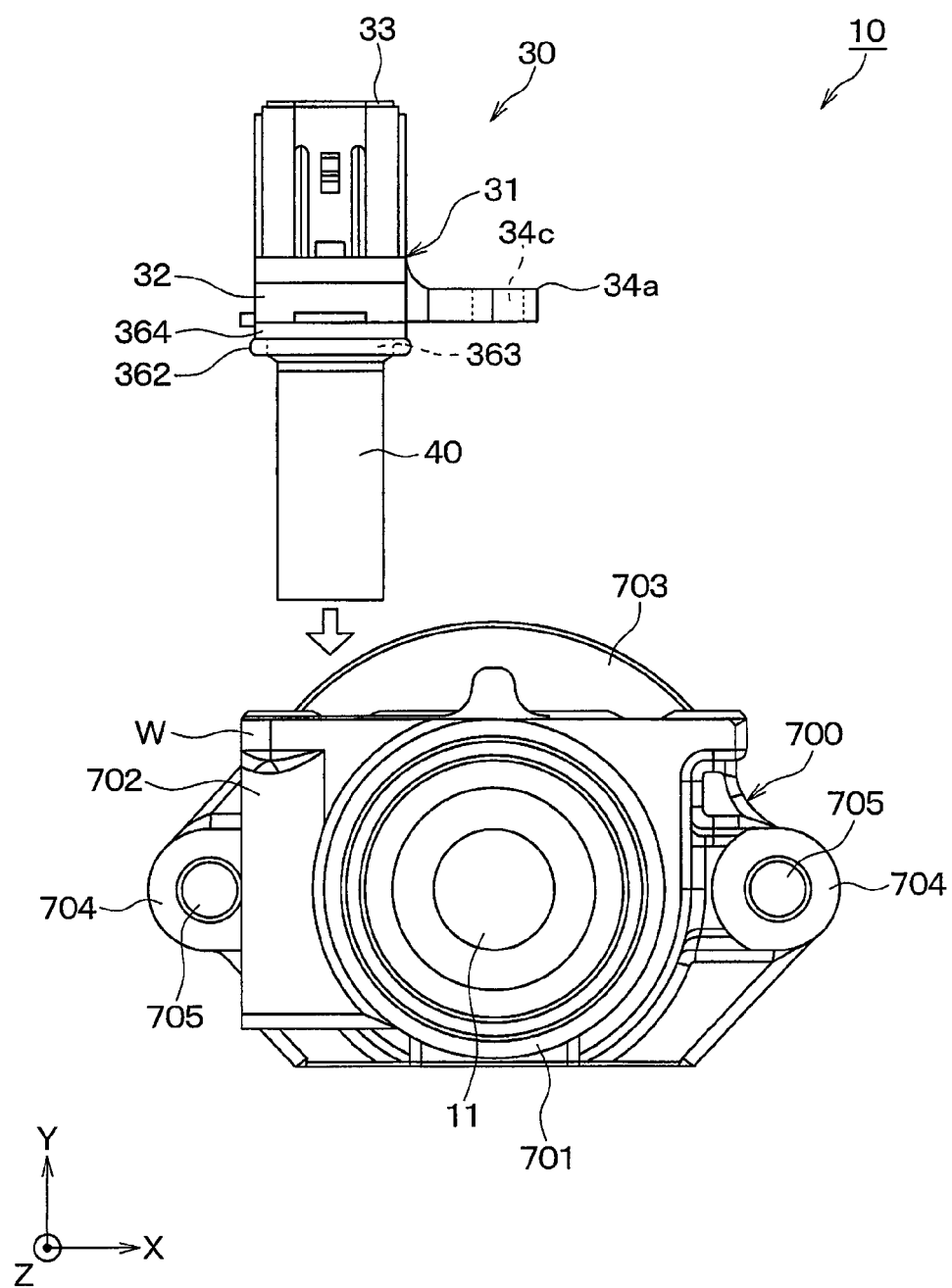
FIG. 22 is a plan view of the torque detection device illustrated in FIG. 21.
Figure 23:
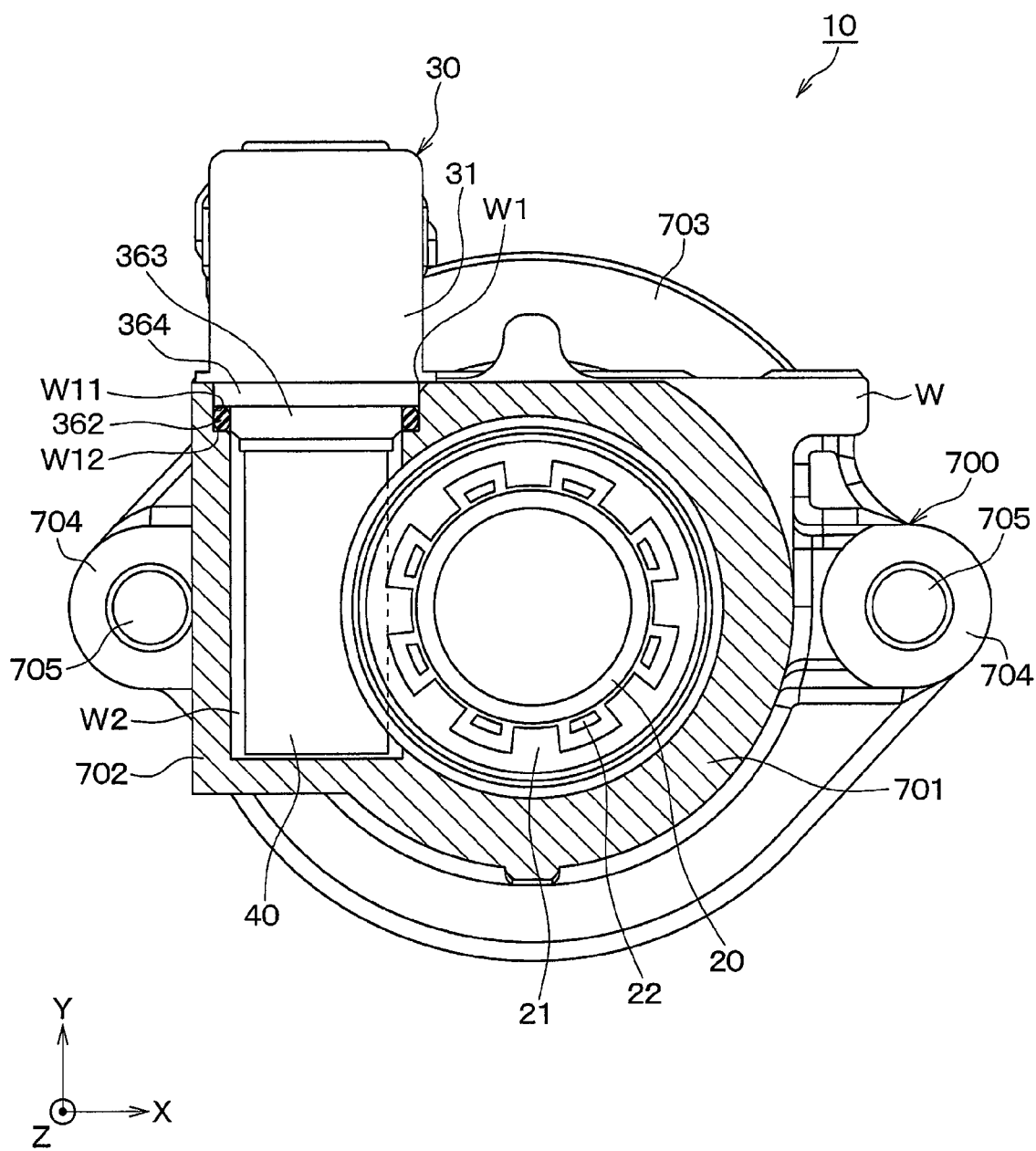
FIG. 23 is a partially sectional and plan view illustrating the configuration of the torque detection device illustrated in FIG. 21.

In the configuration of the present concrete example, as illustrated in FIGS. 21 and 22, the circuit board module 40 is inserted into the sensor module housing part 702 in a state in which the O-ring 362 is held by the step formed between the first seal holding part 363 and the second seal holding part 364. In FIG. 22, an inserting direction, that is, a moving direction of the sensor module at this time is indicated by an arrow.

Then, the sensor module 30 with the sensor housing 31 kept in intimate contact with the mounting surface W3 is fixed to the mounting surface W3 with the bolt (not illustrated) inserted in the fixing hole 34c. Accordingly, the sensor module 30 is mounted on the main housing 700.

In a state in which the sensor module 30 is mounted on the main housing 700, the O-ring 362 is held between the step formed by the first seal holding part 363 and the second seal holding part 364 and the step formed by the axial seal surface W11 and the facing surface W12. At this time, the O-ring 362 receives a pressing force in the projecting direction, that is, the thickness direction of the O-ring 362 and further receives a pressing force in the ring radial direction, that is, a direction along the XZ plane. That is, the axial seal structure described above is achieved.

In such a configuration, the O-ring 362 is pressed in the ring radial direction which intersects the projecting direction between the columnar surface-shaped outer peripheral face of the first seal holding part 363 and the axial seal surface W11 which is the inner peripheral face of the mounting hole W1. Accordingly, the sensor housing 31 and the housing wall W can be more reliably liquid-tightly joined together.

Figure 24:
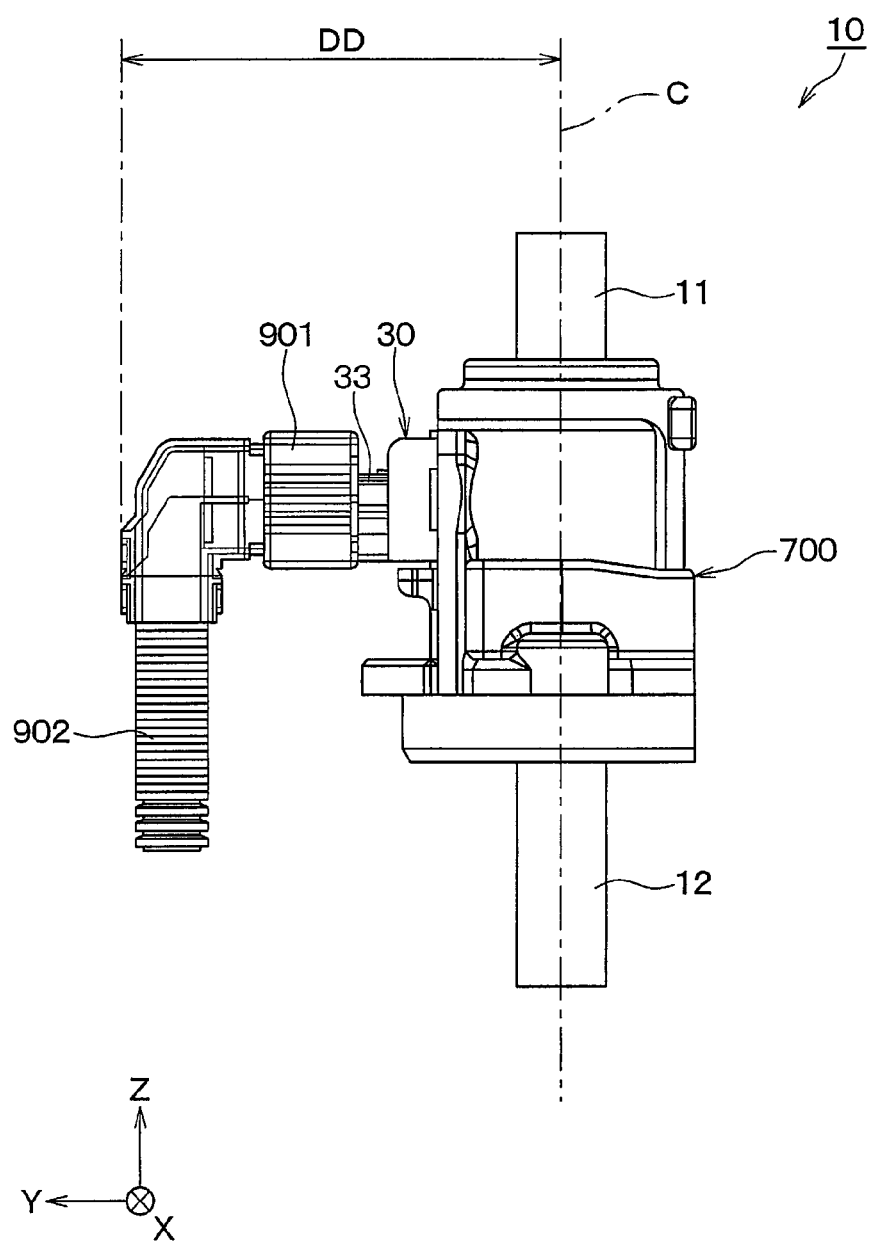
FIG. 24 is a side view of the torque detection device illustrated in FIG. 21.

FIG. 24 illustrates a state in which an ECU side connector 901, which is a waterproof type connector, is connected to the connector part 33, which is a waterproof type connector, of the sensor module 30 mounted on the main housing 700. The ECU side connector 901 is an L-shaped connector and disposed on the distal end of a waterproof cable 902. The waterproof cable 902 is electrically connected to an ECU which is a control unit of the electric power steering apparatus 1.

The configuration of the present concrete example satisfactorily achieves the "perfect waterproofing" in the torque detection device 10 by the waterproof seal structure in the coupling part between the sensor housing 31 and the circuit board module 40, the waterproof structure of the circuit board module 40, and, further, the waterproof connector used as the connector part 33. Thus, such a configuration makes it possible to achieve excellent waterproofness in the electric power steering apparatus 1 and the torque detection device 10 also in a heavy wet environment.

As illustrated in FIG. 24, the configuration of the present concrete example also has the offset structure described above. Thus, with the configuration of the present concrete example, the circuit board module 40 is inserted deep in the internal space of the main housing 700. Thus, the present concrete example makes it possible to reduce a radial-direction dimension DD of the torque detection device 10 in a used state to the extent possible. The "used state" is substantially synonymous with the "onboard state" and indicates a state in which the torque detection device 10 is installed in the electric power steering apparatus 1 and capable of transmitting an electric signal according to the operating state of the steering wheel 5 to the external device.

The configuration of the torque detection device 10 including the main housing 700 illustrated in FIGS. 21 to 24 is applicable also to the column type electric power steering apparatus 1 illustrated in FIG. 1. In this case, the structure relating to the joint flange part 703 may be appropriately changed from the structure illustrated in FIG. 21 or the like.

Figure 25:
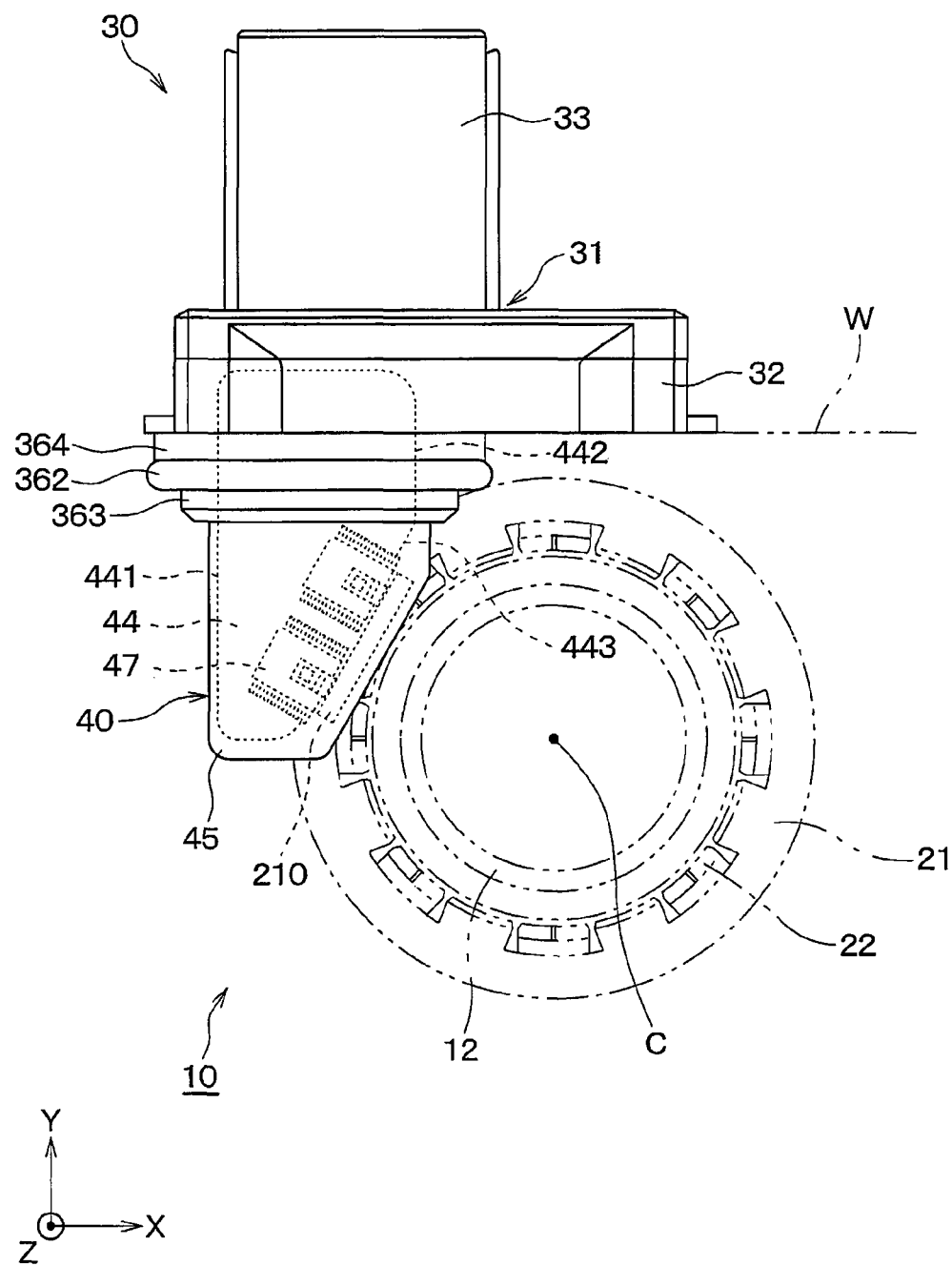
FIG. 25 is a plan view of a torque detection device of an eleventh modification.

FIG. 25 illustrates a partial modification of the configuration of FIG. 24. In FIG. 25, for the purpose of mainly describing the configuration of the circuit board module 40, the first magnetic circuit part 21 and the second magnetic circuit part 22 are indicated by chain double-dashed lines, and the circuit board module 40 is illustrated on the front side in the drawing relative to the first magnetic circuit part 21 and the second magnetic circuit part 22.

Referring to FIG. 25, the magnetic sensor 47 is disposed in an inclined state in plan view on the circuit board module 40. Specifically, the circuit board module 40 is formed in such a manner that an edge on one end side in the width direction, that is, an edge on the X-axis positive direction side is more separated from the rotation center axis C with distance from the sensor housing 31. The magnetic sensor 47 is disposed near the edge.

That is, the circuit board 44 includes a first edge 441, a second edge 442, and a third edge 443 in plan view. The first edge 441 is an edge on the other end side in the width direction, that is, an edge on the X-axis negative direction side, and extends parallel to the projecting direction. The second edge 442 is a part on one end side, that is, on the base end side in the projecting direction of an edge on one end side in the width direction, that is, an edge on the X-axis positive direction side, and extends parallel to the projecting direction. The third edge 443 is a part on the other end side, that is, on the tip side in the projecting direction of the edge on the one end side in the width direction, that is, the edge on the X-axis positive direction side, and extends in a direction intersecting the projecting direction. The third edge 443 is inclined so as to be more separated from the rotation center axis C with distance from the sensor housing 31 in plan view. The magnetic sensor 47 is disposed along the third edge 443.

Also in the configuration of the present concrete example, the circuit board module 40 has the waterproof structure in which the circuit board 44, the first magnetism collecting member 210, and the second magnetism collecting member 220 are over-molded with the covering member 45. The first magnetism collecting member 210 and the second magnetism collecting member 220 are disposed along the third edge 443. For convenience of illustration, the second magnetism collecting member 220 is not illustrated in FIG. 25.

Hereinbelow, a position where the gap between the first magnetism collecting member 210 and the second magnetism collecting member 220 faces the third edge 443 is merely referred to as a "facing position". Further, a configuration in which the third edge 443 extends parallel to the projecting direction (that is, refer to the configuration illustrated in FIG. 23) is referred to as a "normal offset configuration".

In the normal offset configuration, the facing position is located on the X-axis negative direction side from the rotation center axis C. On the other hand, in the configuration of the present concrete example, the facing position is a position rotated about the rotation center axis C by approximately 30° in the clockwise direction in FIG. 25 from the position in the case of the normal offset configuration. That is, in the configuration of the present concrete example, the facing position is closer to the rotation center axis center C in the width direction and closer to the sensor housing 31 in the projecting direction than the normal offset configuration.

The configuration of the present concrete example makes it possible to bring the circuit board module 40 closer to the rotation center axis C than the normal offset configuration. Accordingly, it is possible to reduce the radial-direction size of the sensor module housing part 702 (refer to FIG. 23 or the like) to the extent possible. Thus, such a configuration further improves the vehicle mountability of the torque detection device 10.

Further, the configuration of the present concrete example makes it possible to make the projecting-direction dimension of the circuit board module 40 smaller than that in the normal offset configuration. Specifically, for example, the tip position in the projecting direction of the circuit board 44 can be set substantially equal to the rotation center axis C or on the base end side relative to the rotation center axis C. Accordingly, it is possible to reduce the projecting-direction size of the sensor module housing part 702 (refer to FIG. 23 or the like) to the extent possible. Thus, such a configuration further improves the vehicle mountability of the torque detection device 10.

The waterproof structure also serves as a dustproof structure. That is, the waterproof structure as described above can also achieve an excellent dustproof effect.

In the above description, a plurality of elements formed integrally with each other with no seam may be formed by bonding separate members together. Similarly, a plurality of elements formed by bonding separate members together may be formed integrally with each other with no seam.

In the above description, a plurality of elements formed of the same material may be formed of different materials. Similarly, a plurality of elements formed of different materials may be formed of the same material.

The modifications are also not limited to the above examples. Further, a plurality of modifications may be combined together. Further, the whole or part of the above embodiment and the whole or part of each modification may be combined together.

What is claimed is:

1. A torque detection device configured to output an electric signal corresponding to a torsional torque generated in a torsion bar that coaxially couples a first shaft and a second shaft together on a rotation center axis, the torsional torque being caused by relative rotation between the first shaft and the second shaft about the rotation center axis, the torque detection device comprising:

a first magnetic circuit part disposed on one side of a
        multipolar magnet in an axial direction parallel to the rotation center axis, the multipolar magnet being configured in such a manner that magnetic poles are alternately inverted in a circumferential direction surrounding the rotation center axis and being disposed coaxially with the torsion bar so as to rotate about the rotation center axis along with the relative rotation;

a second magnetic circuit part disposed on the other side of the multipolar magnet in the axial direction;

a plurality of magnetic sensors disposed between the first magnetic circuit part and the second magnetic circuit part so as to output an electric signal corresponding to a magnetic flux density in a magnetic circuit formed by the first magnetic circuit part and the second magnetic circuit part, the plurality of magnetic sensors being arranged in an arrangement direction included in a plane intersecting the axial direction;

a circuit board module including the plurality of magnetic sensors mounted thereon and facing the magnetic circuit on one end side in a width direction, the width direction being included in the plane and intersecting the arrangement direction; and a sensor housing coupled to one end side in the arrangement direction of the circuit board module so as to support the circuit board module on the one end side in the arrangement direction of the circuit board module, wherein the circuit board module has a waterproof structure that covers a plurality of circuit elements including the plurality of magnetic sensors and a circuit board on which the plurality of circuit elements are mounted with a waterproof covering member, a waterproof seal member is disposed on a coupling part between the sensor housing and the circuit board module, the waterproof seal member is formed in a ring-like shape, and the waterproof seal member is formed in such a manner that an outer diameter in the axial direction is smaller than a dimension in the axial direction of an end face of the sensor housing from which the circuit board module projects.

2. The torque detection device according to claim 1, wherein the first magnetic circuit part includes a first yoke member including a plurality of first tooth parts arranged in the circumferential direction so as to surround the multipolar magnet and a first magnetism collecting member disposed close to the first yoke member so as to be magnetically coupled to the first yoke member, the second magnetic circuit part includes a second yoke member including a plurality of second tooth parts arranged in the circumferential direction so as to surround the multipolar magnet and a second magnetism collecting member disposed close to the second yoke member so as to be magnetically coupled to the second yoke member, the second magnetism collecting member being opposed to the first magnetism collecting member in the axial direction, and the plurality of magnetic sensors are disposed in a magnetic gap formed between the first magnetism collecting member and the second magnetism collecting member.

3. The torque detection device according to claim 1, wherein the circuit board module includes:

a base part that is formed in a columnar shape and coupled to the sensor housing; and a sensor mounting part that is formed in a plate-like shape and projects in the arrangement direction from the base part, the plurality of circuit elements are covered with the covering member and disposed on the sensor mounting part, and the waterproof seal member is disposed on a coupling part between the base part and the sensor housing.

4. The torque detection device according to claim 1, wherein the sensor housing includes a flange part extending in a flange extending direction from the other end side toward the one end side in the width direction of the circuit board module, the flange part includes a fixing hole penetrating the flange part in a direction perpendicular to the flange extending direction and the axial direction, and the fixing hole overlaps the first magnetic circuit part, the second magnetic circuit part, or the multipolar magnet when viewed in the arrangement direction.

5. The torque detection device according to claim 1, wherein the circuit board module is formed in such a manner that a dimension in the width direction of the circuit board module in the coupling part between the sensor housing and the circuit board module is smaller than a projecting dimension of the circuit board module from the sensor housing.

6. A sensor module mounted on a wall member constituting a casing in an electric power steering apparatus to constitute a torque detection device in the electric power steering apparatus together with a multipolar magnet disposed coaxially with a torsion bar that coaxially couples a first shaft and a second shaft together on a rotation center axis, the multipolar magnet being housed inside the wall member, a first magnetic circuit part disposed on one side of the multipolar magnet in an axial direction parallel to the rotation center axis, and a second magnetic circuit part disposed on the other side of the multipolar magnet in the axial direction, the sensor module comprising:

a plurality of magnetic sensors disposed between the first magnetic circuit part and the second magnetic circuit part so as to output an electric signal corresponding to a magnetic flux density in a magnetic circuit formed by the first magnetic circuit part and the second magnetic circuit part, the plurality of magnetic sensors being arranged in an arrangement direction included in a plane intersecting the axial direction;

a circuit board module including the plurality of magnetic sensors mounted on the circuit board module and facing the magnetic circuit on one end side in a width direction, the width direction being included in the plane and intersecting the arrangement direction; and a sensor housing coupled to one end side in the arrangement direction of the circuit board module so as to support the circuit board module on the one end side in the arrangement direction of the circuit board module, wherein the circuit board module has a waterproof structure that covers a plurality of circuit elements including the plurality of magnetic sensors and a circuit board on which the plurality of circuit elements are mounted with a waterproof covering member, a waterproof seal member is disposed on a coupling part between the sensor housing and the circuit board module, the waterproof seal member is formed in a ring-like shape, and the waterproof seal member is formed in such a manner that an outer diameter in the axial direction is smaller than a dimension in the axial direction of an end face of the sensor housing from which the circuit board module projects.

7. A sensor module mounted on a wall member constituting a casing in an electric power steering apparatus to constitute a torque detection device in the electric power steering apparatus together with a multipolar magnet disposed coaxially with a torsion bar that coaxially couples a first shaft and a second shaft together on a rotation center axis, the multipolar magnet being housed inside the wall member, a first magnetic circuit part disposed on one side of the multipolar magnet in an axial direction parallel to the rotation center axis, and a second magnetic circuit part disposed on the other side of the multipolar magnet in the axial direction, the sensor module comprising:

a magnetic sensor disposed between the first magnetic circuit part and the second magnetic circuit part so as to output an electric signal corresponding to a magnetic flux density in a magnetic circuit formed by the first magnetic circuit part and the second magnetic circuit part;

a circuit board module projecting in a projecting direction included in a plane intersecting the axial direction, the circuit board module including the magnetic sensor mounted on the circuit board module and facing the magnetic circuit on one end side in a width direction, the width direction being included in the plane and intersecting the projecting direction; and a sensor housing coupled to one end side in the projecting direction of the circuit board module so as to support the circuit board module on the one end side in the projecting direction of the circuit board module, wherein the circuit board module has a waterproof structure that covers a plurality of circuit elements including the magnetic sensor and a circuit board on which the plurality of circuit elements are mounted with a waterproof covering member, a waterproof seal member is disposed on a coupling part between the sensor housing and the circuit board module, the waterproof seal member is formed in a ring-like shape, and the waterproof seal member is formed in such a manner that an outer diameter in the axial direction is smaller than a dimension in the axial direction of an end face of the sensor housing from which the circuit board module projects.

8. The sensor module according to 7, wherein
the circuit board module is formed in such a manner that an edge on the one end side in the width direction is more separated from the rotation center axis with distance from the sensor housing, and the magnetic sensor is disposed near the edge.

9. A torque detection device configured to output an electric signal corresponding to a torsional torque generated in a torsion bar that coaxially couples a first shaft and a second shaft together on a rotation center axis, the torsional torque being caused by relative rotation between the first shaft and the second shaft about the rotation center axis, the torque detection device comprising:

a first magnetic circuit part disposed on one side of a multipolar magnet in an axial direction parallel to the rotation center axis, the multipolar magnet being configured in such a manner that magnetic poles are alternately inverted in a circumferential direction surrounding the rotation center axis and being disposed coaxially with the torsion bar so as to rotate about the rotation center axis along with the relative rotation;

a second magnetic circuit part disposed on the other side of the multipolar magnet in the axial direction;

one or more magnetic sensors disposed between the first magnetic circuit part and the second magnetic circuit part so as to output an electric signal corresponding to a magnetic flux density in a magnetic circuit formed by the first magnetic circuit part and the second magnetic circuit part; and a circuit board module projecting in a projecting direction included in a plane intersecting the axial direction, the circuit board module including the magnetic sensors mounted on the circuit board module and facing the magnetic circuit, wherein the circuit board module has a waterproof structure that covers a plurality of circuit elements including the magnetic sensors and a circuit board on which the plurality of circuit elements are mounted with a waterproof covering member, wherein a sensor housing is coupled to one end side in the projecting direction of the circuit board module so as to support the circuit board module on the one end side in the projecting direction of the circuit board module, a coupling part between the sensor housing and the circuit board module has a waterproof seal structure, an O-ring is attached so as to surround the coupling part between the sensor housing and the circuit board module, and the O-ring is pressed in a ring radial direction intersecting the projecting direction between the coupling part and the wall member to liquid-tightly join the sensor housing to the wall member.

10. The torque detection device according to claim 9, wherein the first magnetic circuit part includes a first yoke member including a plurality of first tooth parts arranged in the circumferential direction so as to surround the multipolar magnet and a first magnetism collecting member disposed close to the first yoke member so as to be magnetically coupled to the first yoke member, the second magnetic circuit part includes a second yoke member including a plurality of second tooth parts arranged in the circumferential direction so as to surround the multipolar magnet and a second magnetism collecting member disposed close to the second yoke member so as to be magnetically coupled to the second yoke member, the second magnetism collecting member being opposed to the first magnetism collecting member in the axial direction, the magnetic sensors are disposed in a magnetic gap formed between the first magnetism collecting member and the second magnetism collecting member, and the covering member covers the first magnetism collecting member and the second magnetism collecting member.

11. The torque detection device according to claim 9, wherein the covering member covers an object to be covered so that the object to be covered is not exposed.

12. The torque detection device according to claim 9, wherein the sensor housing includes a waterproof connector for electrical connection with an external device.

13. The torque detection device according to claim 9, wherein the sensor housing is configured to be liquid-tightly joined to a wall member constituting a casing in an electric power steering apparatus.

14. The torque detection device according to claim 9, wherein the circuit board module includes the magnetic sensors mounted on the circuit board module on one end side in a width direction, the width direction being included in the plane and intersecting the projecting direction.

15. The torque detection device according to claim 9, wherein a plurality of the magnetic sensors are arranged in the projecting direction.

* * * * *